(12) United States Patent
Santurkar et al.

(10) Patent No.: US 7,423,450 B2
(45) Date of Patent: Sep. 9, 2008

(54) TECHNIQUES FOR PROVIDING CALIBRATED ON-CHIP TERMINATION IMPEDANCE

(75) Inventors: Vikram Santurkar, Fremont, CA (US); Hyun Yi, Sunnyvale, CA (US)

(73) Assignee: Altera Corporation, San Jose, CA (US)

( * ) Notice: Subject to any disclaimer, the term of this patent is extended or adjusted under 35 U.S.C. 154(b) by 42 days.

(21) Appl. No.: 11/466,451

(22) Filed: Aug. 22, 2006

(65) Prior Publication Data

US 2008/0061818 A1    Mar. 13, 2008

(51) Int. Cl.
    *H03K 17/16* (2006.01)
(52) U.S. Cl. .............................. 326/30; 326/86; 326/108
(58) Field of Classification Search .................. 326/30; 327/108
    See application file for complete search history.

(56) References Cited

U.S. PATENT DOCUMENTS

| | | | |
|---|---|---|---|
| 4,719,369 A | 1/1988 | Asano et al. | |
| 5,134,311 A | 7/1992 | Biber et al. | |
| 5,254,883 A * | 10/1993 | Horowitz et al. | ............... 326/30 |
| 5,559,448 A | 9/1996 | Koenig | |
| 5,764,080 A | 6/1998 | Huang et al. | |
| 5,955,911 A | 9/1999 | Drost et al. | |
| 6,064,224 A | 5/2000 | Esch et al. | |
| 6,094,069 A | 7/2000 | Magane et al. | |
| 6,118,310 A | 9/2000 | Esch et al. | |
| 6,366,128 B1 | 4/2002 | Ghia et al. | |
| 6,433,579 B1 | 8/2002 | Wang et al. | |
| 6,445,245 B1 | 9/2002 | Schultz et al. | |
| 6,489,837 B2 | 12/2002 | Schultz et al. | |
| 6,586,964 B1 | 7/2003 | Kent et al. | |
| 6,590,413 B1 | 7/2003 | Yang | |
| 6,603,329 B1 | 8/2003 | Wang et al. | |
| 6,798,237 B1 | 9/2004 | Wang et al. | |
| 6,812,732 B1 | 11/2004 | Bui et al. | |
| 6,812,734 B1 | 11/2004 | Shumarayev et al. | |
| 6,833,729 B2 * | 12/2004 | Kim et al. | ..................... 326/30 |
| 6,836,144 B1 | 12/2004 | Bui et al. | |
| 6,876,248 B2 * | 4/2005 | Nguyen et al. | .............. 327/538 |
| 6,888,369 B1 | 5/2005 | Wang et al. | |
| 6,888,370 B1 | 5/2005 | Luo et al. | |

(Continued)

OTHER PUBLICATIONS

U.S. Appl. No. 11/040,343, filed Jan. 20, 2005, Chang et al.

(Continued)

*Primary Examiner*—Vibol Tan
(74) *Attorney, Agent, or Firm*—Steven J. Cahill

(57) ABSTRACT

Techniques are provided for calibrating on-chip termination impedances on integrated circuits. An on-chip termination (OCT) calibration circuit generates calibration codes that selectively control the conductive states of a set of transistors coupled in parallel. The OCT calibration circuit selects a calibration code that causes the impedance of the transistors to be near a matching impedance. The selected calibration code controls an on-chip termination impedance at a pin. According to some embodiments, the OCT calibration circuit compares a signal from the transistors to two or more reference signals to improve the tolerance range of the calibrated on-chip termination impedance. According to other embodiments, the OCT calibration circuit selects a calibration code based on a signal from the transistors after an extra transistor is turned on by a control signal. The control signal is not used to control the on-chip termination impedance.

47 Claims, 14 Drawing Sheets

U.S. PATENT DOCUMENTS

| | | | |
|---|---|---|---|
| 6,980,022 | B1 | 12/2005 | Shumarayev et al. |
| 7,218,155 | B1 * | 5/2007 | Chang et al. ............... 327/108 |
| 7,221,193 | B1 | 5/2007 | Wang et al. |
| 7,230,448 | B2 * | 6/2007 | Choe ........................ 326/30 |
| 7,239,171 | B1 * | 7/2007 | Wang et al. ................. 326/30 |
| 2002/0101278 | A1 | 8/2002 | Schultz et al. |
| 2004/0008054 | A1 | 1/2004 | Lesea et al. |
| 2004/0113653 | A1 | 6/2004 | Lundberg |
| 2005/0012533 | A1 | 1/2005 | Aoyama et al. |
| 2007/0236247 | A1 | 10/2007 | Wang et al. |

OTHER PUBLICATIONS

U.S. Appl. No. 11/040,048, filed Jan. 20, 2005, Wang et al.
"Virtex-II Pro and Virtex-II Pro X FPGA User Guide," Mar. 23, 2005, pp. 223-240.
"Stratix II Device Handbook, vol. 2: 4. Selectable I/O Standards In Stratix II & Stratix II GX Devices," Altera Corporation, Dec. 2005, pp. 4-1 through 4-42.
"Virtex-4 User Guide," Mar. 21, 2006.
U.S. Appl. No. 11/462,702, filed Aug. 05, 2006, Wang et al.
U.S. Appl. No. 11/356,867, filed Feb. 18, 2006, Santurkar et al.

* cited by examiner

TECHNIQUES FOR PROVIDING CALIBRATED ON-CHIP TERMINATION IMPEDANCE

BACKGROUND OF THE INVENTION

The present invention relates to electronic circuits, and more particularly, to techniques for providing calibrated on-chip termination impedance on integrated circuits.

Signal reflection can occur on transmission lines when there is a mismatch between the impedance of the transmission line and the impedance of the transmitter and/or receiver. The reflected signal can interfere with the transmitted signal, causing distortion and degrading signal integrity.

To solve this problem, transmission lines are resistively terminated by a matching impedance to minimize or eliminate signal reflection. Input/output (I/O) pins on an integrated circuit package are often terminated by coupling external termination resistors to the appropriate I/O pins. However, many integrated circuit packages require a large number of termination resistors, because they have a large number of I/O pins. Therefore, it is becoming more common to resistively terminate transmission lines using on-chip termination (OCT) circuits to reduce the number of external components and to conserve board area.

In order to improve the accuracy of on-chip termination (OCT) circuits, a calibration circuit can be used to calibrate the on-chip termination circuit using an off-chip resistor as a reference value. Un-calibrated on-chip termination circuits can have tolerances in the range of +/−30% of the nominal value. A calibration circuit can improve the tolerance range of an on-chip termination circuit, e.g., to within +/−20%.

However, in many applications, a higher degree of accuracy is required. Therefore, it would be desirable to provide further improvements in the tolerance range of on-chip termination circuits without incurring a significant increase in the die size of an integrated circuit.

BRIEF SUMMARY OF THE INVENTION

The present invention provides techniques for calibrating on-chip termination impedances on integrated circuits. An on-chip termination (OCT) calibration circuit generates calibration codes that selectively control the conductive states of a set of transistors coupled in parallel. The OCT calibration circuit selects a calibration code that causes the impedance of the transistors to be near a matching impedance value. The selected calibration code is transmitted to an input or output buffer to control an on-chip termination impedance at a pin.

According to some embodiments of the present invention, the OCT calibration circuit compares a signal from the transistors to two or more reference signals to improve the tolerance range of the calibrated on-chip termination impedance. The signal from the transistors can be compared to two or more reference signals using two or more comparators. Alternatively, the signal from the transistors can be compared to two or more reference signals using a select logic circuit.

According to other embodiments of the present invention, the OCT calibration circuit controls the conductive state of an extra transistor using a control signal. The extra transistor is coupled in parallel with the other transistors. The OCT calibration circuit selects a calibration code based on a signal from the transistors after the extra transistor is turned on. The control signal used to control the extra transistor is not used to control the on-chip termination impedance.

Other objects, features, and advantages of the present invention will become apparent upon consideration of the following detailed description and the accompanying drawings.

DETAILED DESCRIPTION OF THE INVENTION

Figure 1A:
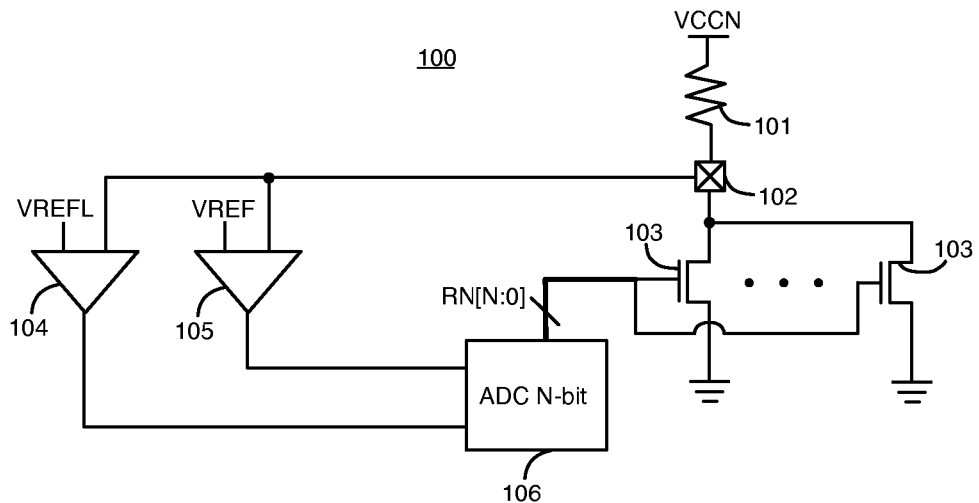
FIG. 1A illustrates a pull-down portion of an on-chip termination (OCT) calibration circuit that compares a voltage at a pin to two reference voltages using two comparators, according to an embodiment of the present invention.
Figure 1B:
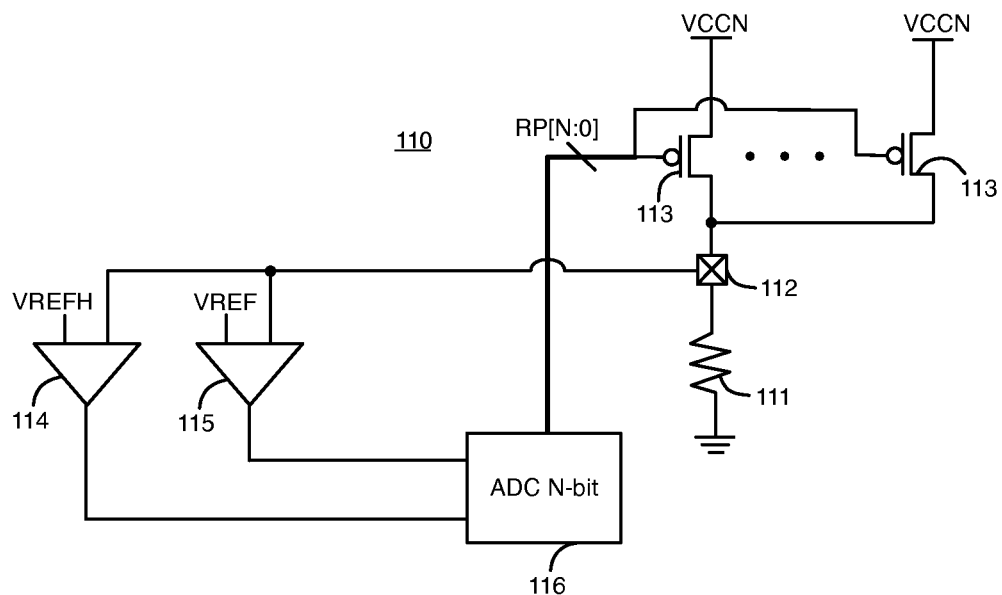
FIG. 1B illustrates a pull-up portion of an on-chip termination (OCT) calibration circuit that compares a voltage at a pin to two reference voltages using two comparators, according to an embodiment of the present invention.

FIGS. 1A and 1B illustrate an on-chip termination (OCT) calibration circuit block, according to a first embodiment of the present invention. The on-chip calibration block has a pull-down portion 100 shown in FIG. 1A and a pull-up portion 110 shown in FIG. 1B.

Pull-down portion 100 includes a pin 102, two comparators 104 and 105, an N-bit analog-to-digital converter (ADC) 106, and pull-down transistors 103. ADC 106 and comparators 104-105 form a feedback loop that is coupled to transistors 103.

Transistors 103 represent any number N of transistors (e.g., 4, 5, 6, 7, 8, 9, 10, etc.). Transistors 103 can be, for example, NMOS field-effect transistors. Transistors 103 are coupled together in parallel between pin 102 and ground. Transistors 103 have binary weighted channel width-to-length (W/L) ratios. For example, the channel W/L ratios of 8 binary weighted transistors 103 can be 1×, 2×, 4×, 8×, 16×, 32×, 64×, and 128×. Transistor channel W/L ratios are also referred to herein as transistor sizes.

The on-chip calibration circuit of FIGS. 1A-1B is typically part of an integrated circuit (IC). Pin 102 is coupled to an off-chip resistor 101 that is external to the IC. Resistor 101 is coupled to supply voltage VCCN. External resistor 101 and pull-down transistors 103 form a resistor divider circuit. The voltage at pin 102 is a divided down voltage between resistor 101 and transistors 103. Comparator 105 compares the voltage at pin 102 with a first reference voltage VREF. Reference voltage VREF equals one half the supply voltage (i.e., VCCN/2). Comparator 104 compares the voltage at pin 102 with a second reference voltage VREFL. Reference voltage VREFL is less than voltage VREF.

ADC 106 generates digital calibration codes RN[N:0] in response to the two outputs of comparators 104 and 105. Each calibration code RN[N:0] contains an N number of digital bits (signals). Each digital bit in the calibration code RN[N:0] is transmitted to the gate of one of pull-down transistors 103 to selectively turn the transistor on or off.

The calibration code RN[N:0] also selectively enables a set of pull-down transistors in one or more corresponding input or output (I/O) buffers to provide on-chip termination (OCT) impedance to a pin. An example of an I/O buffer is shown in and described below with respect to FIG. 1E.

A board designer selects an off-chip resistor 101 that matches the impedance of the transmission line. OCT calibration circuit portion 100 generates a termination impedance at one or more I/O buffers that is as close to the matching resistance of resistor 101 as possible. In most instances, an OCT calibration circuit approximates the resistance of resistor 101, because transistors 103 (and the transistors in the I/O buffers) generate a limited number of net resistance values. The number of transistors in set 103 and in the I/O buffers can be increased to generate more resistance values. However, increasing the number of transistors that provide termination in an I/O buffer is undesirable, because more transistors increase the pin capacitance and slow down the signal response.

ADC 106 generates varying calibration codes RN[N:0] in response to the output signals of comparators 104-105. Ideally, one of the calibration codes causes the net resistance of transistors 103 to equal the resistance of off-chip resistor 101, which occurs when the voltage at pin 102 equals VREF.

In most instances, none of the possible calibration codes RN[N:0] generates a net resistance for transistors 103 (and corresponding I/O buffers) that exactly equals the resistance of resistor 101. Therefore, OCT calibration circuit portion 100 attempts to generates an on-chip termination resistance that approximates the value of resistor 101 by selecting a calibration code that generates a pin voltage between VREF and VREFL.

Comparators 104 and 105 generate digital output signals (high or low). Thus, comparator 105 can only indicate when the voltage on pin 102 is above or below VREF. The output of comparator 105 does not indicate how far above or below VREF the pin voltage is.

Calibration circuit portion 100 has an additional comparator 104 coupled to a second reference voltage VREFL. When the voltage at pin 102 is above VREF or below VREFL, the outputs of both comparators 104 and 105 are in the same state (i.e., either both at a logic high or a logic low). When the voltage at pin 102 is between VREF and VREFL, the output of comparators 104 and 105 are in different logic states. Thus, the outputs of comparators 104 and 105 provide enough information for ADC 106 to determine when the voltage on pin 102 is between VREF and VREFL.

The feedback loop attempts to achieve a stable pin voltage between VREF and VREFL. ADC 106 turns on different combinations of transistors 103 to determine whether any of the calibration codes RN[N:0] causes the voltage at pin 102 to fall between VREF and VREFL.

The calibration code is initially all zeros, and the pin voltage equals supply voltage VCCN. ADC 106 increases the binary values of the calibration codes RN[N:0] in response to the output signals of comparators 104 and 105. When the binary values of the calibration codes RN[N:0] increase, more current flows through transistors 103, and the pin voltage decreases.

If one of the calibration codes generates a voltage at pin 102 between VREF and VREFL, that calibration code is selected to control the on-chip termination (OCT) impedance in one or more I/O buffers. The calibration code can be selected by maintaining the digital outputs RN[N:0] of ADC 106 constant and sending the digital outputs RN[N:0] of ADC 106 to the I/O buffers. Calibration is now complete as long as the resistances of resistor 101 and transistors 103 remain constant. The on-resistances of transistors 103 can vary in response to temperature changes.

In some instances, one of the calibration codes does not generate a voltage at pin 102 that is between voltages VREF and VREFL. Whether any of the calibration codes generate a pin voltage between VREF and VREFL depends on resistance of resistor 101, the sizes of transistors 103, and the voltage difference between VREF and VREFL.

Figure 1C:
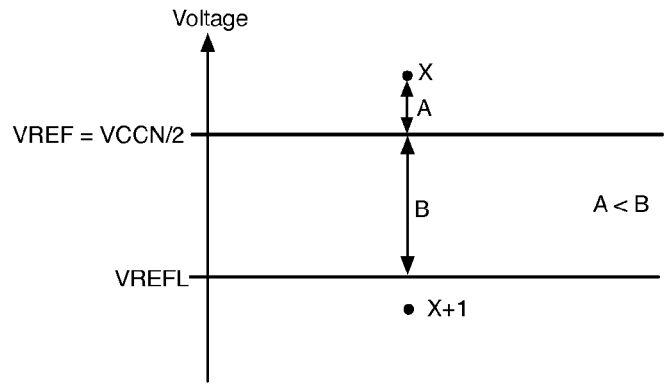
FIG. 1C is a graph that shows two pin voltages near two reference voltages, according to an example implementation of the embodiment of FIG. 1A.

If one of the calibration codes does not generate a pin voltage between VREF and VREFL, the calibration code that generates a pin voltage closest to VREF is selected. FIG. 1C shows the relative locations of VREF and VREFL for portion 100. Two pin voltages, at points X and X+1, that are generated in response to two successive calibration codes RN[N:0] are shown in FIG. 1C, according to one example implementation of FIG. 1A. Point X+1 is just outside the VREF to VREFL band, located below VREFL. Point X is also outside VREF to VREFL band, located above VREF.

The calibration code that generates a pin voltage at point X occurs just before the output of comparator 105 changes state. Point X+1 is generated by a calibration code that equals 1 added to the calibration code that generates point X. Point X+1 is below VREF. Therefore, point X+1 is generated by the first calibration code that causes the output of comparator 105 to change state. In the example of FIG. 1C, point X+1 also causes the output of comparator 104 to change state, because it also below VREFL.

Thus, point X represents the pin voltage closest to VREF and greater than VREF in this example. Point X+1 results in a pin voltage closest to VREFL and less than VREFL.

If the difference D1 between the voltages at point X and point X+1 is less than twice the voltage difference B between VREF and VREFL, point X is closer to VREF than point X+1. The size (i.e., W/L channel ratio) of the smallest transistor in transistor group 103 determines the voltage difference D1 between point X and X+1. The smallest transistor size and the difference between VREF and VREFL can be selected so that OCT calibration portion 100 is able to select a calibration code that generates an on-chip termination resistance within a tight tolerance range, e.g., +/−10% of off-chip resistor 101.

If none of the calibration codes generates a pin voltage between VREF and VREL and D1<2*B, the calibration code that generates a pin voltage at point X is selected to control the on-chip termination (OCT) impedance in one or more I/O buffers. If point X+1 is between VREF and VREFL, the calibration code that generates a pin voltage at point X+1 is selected to control the OCT impedance in the I/O buffers, even if point X is closer to VREF.

According to some embodiments of the present invention ADC 106 can use a binary search algorithm or a successive approximation algorithm to reach a tentative value for the calibration code RN[N:0] without testing every possible binary value of RN[N:0]. If ADC 106 is able to locate a calibration code that generates a pin voltage between VREF and VREFL using one of these algorithms, then the calibration process terminates. However, if none of the calibration codes generate a pin voltage between VREF and VREFL, then the techniques described above are used to select the calibration code that generates the closest pin voltage to VREF.

A binary search algorithm is a technique for finding a particular value in a linear array, by ruling out half of the data at each step. A binary search finds the median, makes a comparison to determine whether the desired value comes before or after it, and then searches the remaining half in the same manner. Successive approximation is a well-known technique used in analog-to-digital converters.

Referring now to FIG. 1B, pull-up portion 110 includes a pin 112, two comparators 114 and 115, an N-bit analog-to-digital converter (ADC) 116, and pull-up transistors 113. ADC 116 and comparators 114-115 form a feedback loop that is coupled to transistors 113.

Pull-up transistors 113 represent any number N of transistors (e.g., 4, 5, 6, 7, 8, 9, 10, etc.) that are coupled in parallel between supply voltage VCCN and pin 112. Transistors 113 can be, for example, PMOS field-effect transistors. Pin 112 is coupled to an off-chip resistor 111 that is external to the IC. Resistor 111 is coupled to ground. Transistors 113 have binary weighted channel width-to-length (W/L) ratios. For example, the channel W/L ratios of 8 binary weighted transistors 113 can be 1×, 2×, 4×, 8×, 16×, 32×, 64×, and 128×.

External resistor 111 and pull-up transistors 113 form a resistor divider circuit. The voltage at pin 112 is a divided down voltage between resistor 111 and transistors 113. Comparator 115 compares the voltage at pin 112 with reference voltage VREF. As mentioned above, reference voltage VREF equals one half the supply voltage (i.e., VCCN/2). Comparator 114 compares the voltage at pin 112 with a third reference voltage VREFH. Reference voltage VREFH is greater than voltage VREF.

ADC 116 generates digital calibration codes RP[N:0] in response to the two output signals of comparators 114 and 115. Each calibration code RP[N:0] contains an N number of digital bits (signals). Each digital bit in the calibration code is transmitted to the gate of one of pull-up transistors 113 to selectively turn the transistor on or off.

The calibration code RP[N:0] also selectively enables a set of pull-up transistors in one or more corresponding input or output (I/O) buffers to provide on-chip termination (OCT) impedance to a pin. An example of an I/O buffer that is controlled by code RP[N:0] is shown in and described below with respect to FIG. 1E.

ADC 116 generates varying calibration codes RP[N:0] in response to the output signals of comparators 114-115. Ideally, one of the calibration codes generates a net resistance for transistors 113 that equals the resistance of off-chip resistor 111. The net resistance of transistors 113 equals resistor 111 when the voltage on pin 112 equals VREF. Resistor 111 represents an on-chip termination impedance value that a board designer wants to generate in one or more I/O buffers.

In most instances, none of the calibration codes RP[N:0] generates a net resistance for transistors 113 (and the transistors in the I/O buffers) that exactly equals resistor 111. Therefore, OCT calibration circuit portion 110 generates an on-chip termination resistance that is approximately equal to resistor 111 by attempting to locate a calibration code that generates a pin voltage between VREFH and VREF.

When the voltage at pin 112 is above VREFH or below VREF, the output signals of both comparators 114 and 115 are in the same state (i.e., either both at a logic high or a logic low). When the voltage at pin 112 is between VREFH and VREF, the output signals of comparators 114 and 115 are in different logic states. Thus, the output signals of comparators 114 and 115 provide enough information for ADC 116 to determine when the voltage on pin 112 is between VREFH and VREF.

At the start of calibration, the calibration code RP[N:0] initially equals all ones, causing all of transistors 113 to be off, and the pin voltage to equal ground. ADC 116 begins by decreasing the binary values of the calibration codes RP[N:0], causing more current to flow through transistors 113 and the pin voltage to increase.

The feedback loop attempts to achieve a stable pin voltage between VREFH and VREF. If one of the calibration codes generates a pin voltage between VREFH and VREF, that calibration code is selected to control the on-chip termination impedance in one or more I/O buffers. The calibration code can be selected by maintaining the digital outputs RP[N:0] of ADC 116 constant and sending the digital outputs RP[N:0] of ADC 116 to the I/O buffers. Calibration is now complete as long as the resistances of resistor 111 and transistors 113 remain constant. The on-resistances of transistors 113 can vary in response to temperature changes.

In some instances, one of the calibration codes does not generate a voltage at pin 112 that is between VREFH and VREF. If none of the calibration codes generate a pin voltage between VREFH and VREF, the calibration code that generates the pin voltage closest to VREF is selected.

Figure 1D:
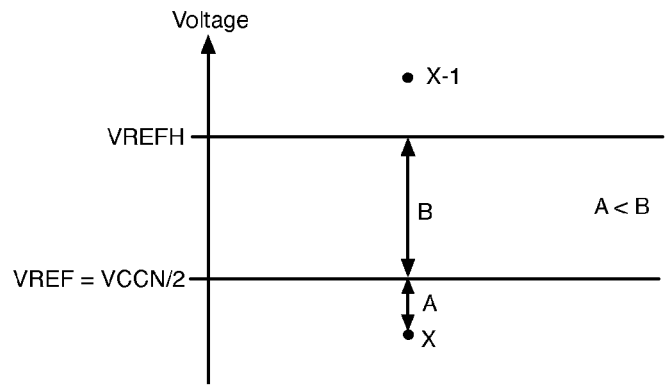
FIG. 1D is a graph that shows two pin voltages near two reference voltages, according to an example implementation of the embodiment of FIG. 1B.

FIG. 1D shows the relative locations of VREF and VREFH for portion 110. Two pin voltages, at points X and X−1, that are generated in response to two successive calibration codes RP[N:0] are shown in FIG. 1D, according to one example implementation of FIG. 1B. Point X−1 is just outside the VREF to VREFH band, located above VREFH. Point X is also outside VREF to VREFH band, located below VREF.

The calibration code that generates a pin voltage at point X occurs just before the output of comparator 115 changes state. Point X−1 is generated by the calibration code that equals 1 subtracted from the calibration code that generates point X. Point X−1 is above VREF. Therefore, point X−1 is generated by the first calibration code that causes the output of comparator 115 to change state. In the example of FIG. 1D, point X−1 also causes the output of comparator 114 to change state, because it also above VREFH.

Thus, point X represents the pin voltage closest to VREF and less than VREF. Point X−1 represents the pin voltage closest to VREFH and greater than VREFH.

If the difference D2 between point X−1 and point X is less than twice the voltage difference B between VREFH and VREF, point X is closer to VREF than point X−1. The smallest transistor size (W/L channel ratio) in group 113 determines the voltage difference D2 between X−1 and X. The smallest transistor size and the difference B between VREFH and VREF can be selected so that OCT calibration portion 110 is able to select a calibration code that generates an on-chip termination resistance within a tight tolerance range, e.g., +/−10% of off-chip resistor 111. In FIGS. 1C and 1D, voltage difference B is greater than voltage difference A.

If none of the calibration codes generate a pin voltage between VREFH and VREF and D2<2*B, the calibration code generating a pin voltage at point X is selected to control the on-chip termination (OCT) impedance in one or more I/O buffers. If point X−1 is between VREF and VREFH, the calibration code generating point X−1 is selected to control the OCT impedance in the I/O buffers, even if point X is closer to VREF.

Figure 1E:
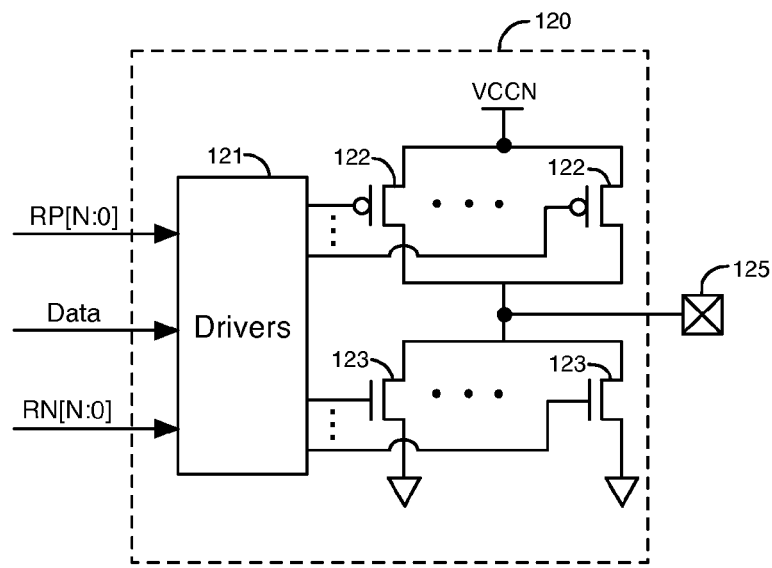
FIG. 1E illustrates a buffer circuit that provides calibrated on-chip termination impedance to a pin in response to a calibration code generated according to the techniques of the present invention.

The selected pull-up and pull-down calibration codes RP[N:0] and RN[N:0] are transmitted to input buffers and/or output buffers to control on-chip termination impedances. FIG. 1E illustrates an example of a buffer circuit 120 that can be used as input buffer or an output buffer. I/O buffer 120 includes drivers 121, a set of pull-up PMOS transistors 122 that are coupled in parallel, and a set of pull-down NMOS transistors 123 that are coupled in parallel. Buffer 120 is coupled to pin 125.

Buffer 120 can have any suitable number of pull-up transistors 122 (e.g., 5, 6, 7, 8, 9 etc.) and pull-down transistors 123 (e.g., 5, 6, 7, 8, 9 etc.). More transistors typically provide a more accurate on-chip termination impedance value. However, adding more pull-up and pull-down transistors to buffer 120 also increases the capacitance at pin 125, which is undesirable because it slows down the signal response.

The number of pull-up transistors 122 in buffer 120 equals the number of pull-up transistors 113 in portion 110, and the number of pull-down transistors 123 equals the number of pull-down transistors 103 in portion 100. Transistors 122 and 123 are binary weighted according to the same binary weighted W/L channel ratios of corresponding transistors 103 and 113.

Each bit in the pull-up calibration code RP[N:0] selectively enables one of the pull-up transistors 122. Each bit in the pull-down calibration code RN[N:0] selectively enables one of the pull-down transistors 123. In an output buffer, the transistors 122 and 123 that are enabled by the calibration codes are turned on and off in response to data signals.

Each bit of calibration code RP[N:0] controls a pull-up transistor 113 and a pull-up transistor 122 that have the same channel W/L ratio. Each bit of calibration code RN[N:0] controls a pull-down transistor 103 and a pull-down transistor 123 that have the same channel W/L ratio. By selectively enabling the transistors 122 and 123, the calibration codes RP[N:0] and RN[N:0] control the on-chip termination impedance provided by buffer 120 at pin 125.

Figure 2A:
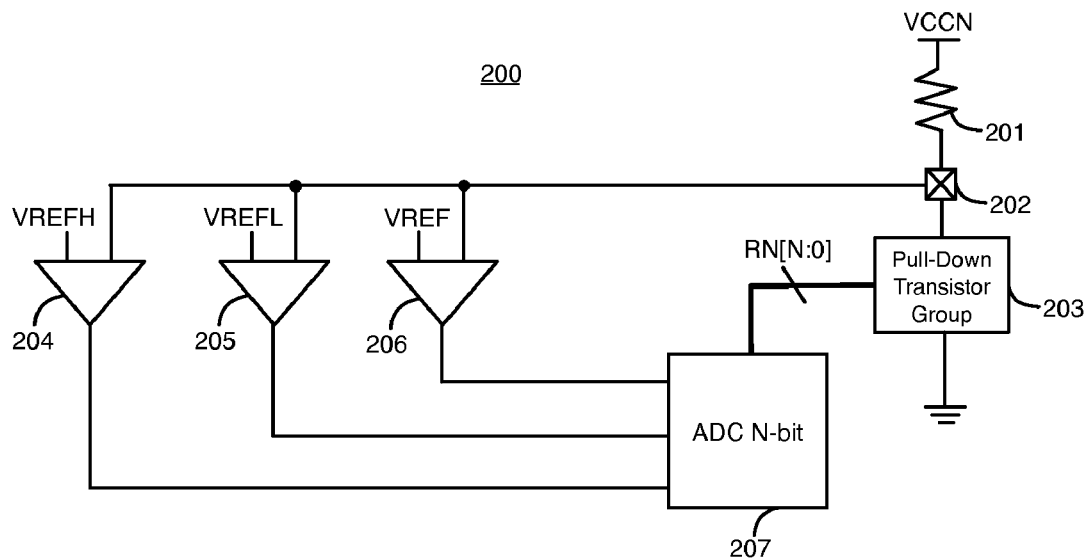
FIG. 2A illustrates a pull-down portion of an on-chip termination (OCT) calibration circuit that compares a voltage at a pin to three reference voltages using three comparators, according to an embodiment of the present invention.
Figure 2B:
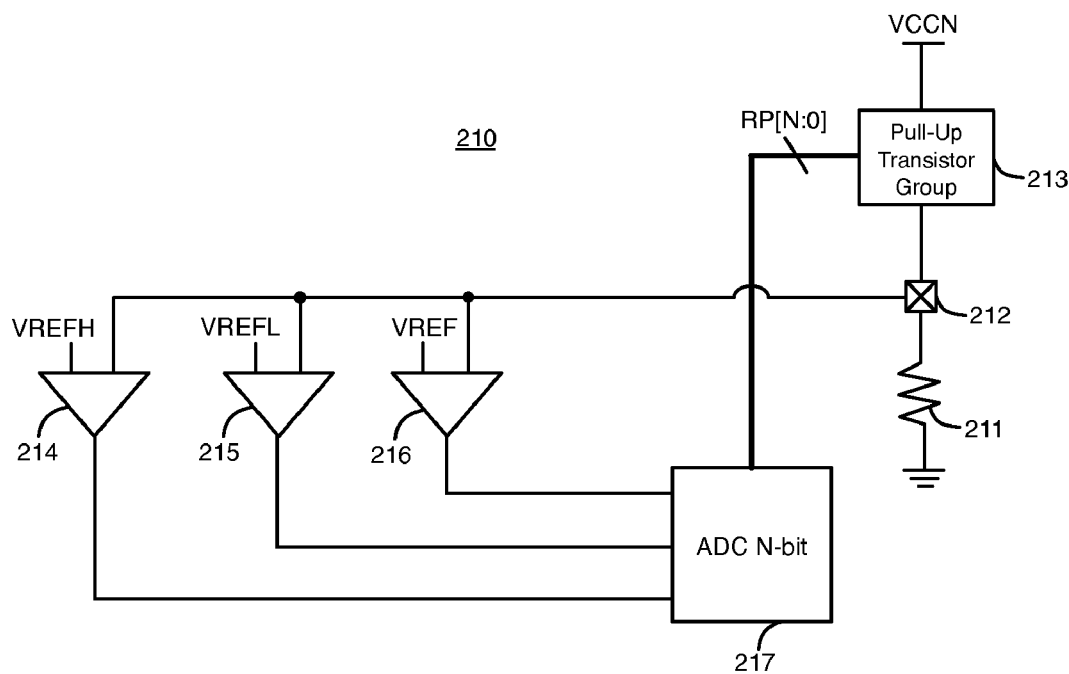
FIG. 2B illustrates a pull-up portion of an on-chip termination (OCT) calibration circuit that compares a voltage at a pin to three reference voltages using three comparators, according to an embodiment of the present invention.

As mentioned above, the OCT calibration circuit of FIGS. 1A-1B selects a calibration point between VREF and VREFH or VREFL, even when another calibration point is closer to VREF. According to a further embodiment of the present invention, an OCT calibration circuit selects a calibration point closer to VREF using three comparators. This embodiment of the present invention is illustrated in FIGS. 2A and 2B. FIG. 2A illustrates a pull-down portion 200 of the OCT calibration circuit, and FIG. 2B illustrates a pull-up portion 210 of the calibration circuit.

Referring to FIG. 2A, OCT calibration circuit portion 200 includes three comparators 204-206, an N-bit analog-to-digital converter (ADC) 207, a group of pull-down transistors 203, and a pin 202. Pin 202 is coupled to an off-chip resistor 201. Pull-down transistor group 203 includes any number N (e.g., 4, 5, 6, 7, 8, 9, etc.) of binary-weighted transistors that are coupled together in parallel, e.g., NMOS field-effect transistors. Transistors 103 shown in FIG. 1A are an example of transistor group 203. Examples of binary weights for the W/L channel ratios of the transistors in group 203 are 1×, 2×, 4×, 8×, 16×, 32×, 64×, and 128×.

Comparator 204 has a first input coupled to a reference voltage VREFH and a second input coupled to pin 202. Comparator 205 has a first input coupled to a reference voltage VREFL and a second input coupled to pin 202. Comparator 206 has a first input coupled to a reference voltage VREF and a second input coupled to pin 202. ADC 207 generates digital calibration codes RN[N:0] in response to the output signals of comparators 204-206. Each bit in calibration code RN[N:0] turns a transistor in group 203 on or off. Comparators 204-206 and ADC 207 form a feedback loop coupled to transistor group 203.

Figure 2C:
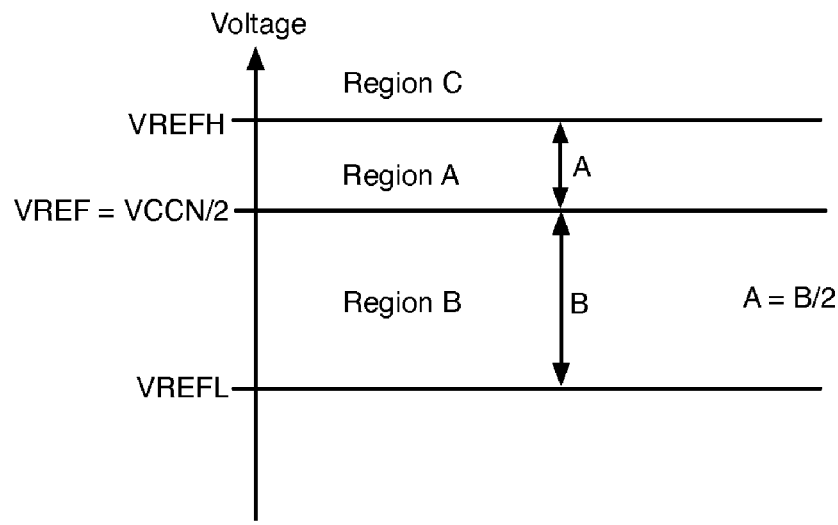
FIG. 2C is a graph that shows relative values of the reference voltages used in an example implementation of the embodiment of FIG. 2A.

FIG. 2C illustrates an example of the relative voltage values of VREF, VREFH, and VREFL for the calibration circuit portion 200 shown in FIG. 2A. In FIG. 2C, the difference A between VREFH and VREF is half the difference B between VREF and VREFL. Thus, A=B/2. According to further embodiments, other ratios between difference A and difference B can be used, e.g., 1:3, 1:1.5, 1:1, etc.

One example implementation of FIG. 2A that is based on the relative reference voltages of FIG. 2C (A=B/2) will now be described. The calibration code RN[N:0] initially equals 0, causing all of the transistors in group 203 to be off, and the pin voltage to equal supply voltage VCCN. ADC 207 begins by increasing the binary values of the calibration codes RN[N:0], causing more current to flow through transistors 203 and causing the pin voltage to decrease.

As the pin voltage falls, ADC 207 analyzes the output signals of the comparators to determine if the output signals of comparators 204 and 206 remain in different states in response to any of the calibration codes. The output signals of comparators 204 and 206 are in different states when the pin voltage is between VREFH and VREF. A calibration code RN[N:0] that generates a pin voltage between VREFH and VREF is preferentially selected to control the OCT in one or more I/O buffers.

If one of the calibration codes does not generate a pin voltage between VREFH and VREF, ADC 207 determines if any of the calibration codes generates a pin voltage between VREF and VREFL. The pin voltage is between VREF and VREFL when the outputs of comparators 205 and 206 are in different states. If a calibration code RN[N:0] generates a pin voltage between VREF and VREFL, that calibration code is selected to control the OCT in one or more I/O buffers.

If a pin voltage is not found between VREFH ad VREFL, the pin voltage in Region C that is closest to VREFH is selected to control the OCT in one or more I/O buffers. Region C includes all voltages that are above VREFH. ADC 207 can subtract one or more from the calibration code to backtrack to the lowest pin voltage in Region C.

In this situation, the nearest pin voltage in region C is the closest pin voltage to VREF, assuming that the difference between two successive pin voltages (one below VREF and one above VREF) is less than twice the difference B. With this assumption, the difference between VREF and the nearest point below VREF is greater than B, and a difference between VREF and the nearest pin voltage in Region C is less than B. This technique can select a pin voltage closer to VREF that results in a better tolerance range for the OCT resistance (e.g., +/−5% of off-chip resistor 201) than the embodiment of FIGS. 1A-1B.

Referring to FIG. 2B, OCT calibration circuit portion 210 includes three comparators 214-216, an N-bit analog-to-digital converter (ADC) 217, a group of pull-up transistors 213, and a pin 212. Pin 212 is coupled to an off-chip resistor 211. Pull-up transistor group 213 includes any number N (e.g., 4, 5, 6, 7, 8, 9, etc.) of binary-weighted transistors that are coupled together in parallel, e.g., PMOS field-effect transistors. Transistors 113 shown in FIG. 1B are an example of transistor group 213. Examples of binary weights for the W/L channel ratios of transistors in group 213 are 1×, 2×, 4×, 8×, 16×, 32×, 64×, and 128×.

Comparator 214 has a first input coupled to a reference voltage VREFH and a second input coupled to pin 212. Comparator 215 has a first input coupled to a reference voltage VREFL and a second input coupled to pin 212. Comparator 216 has a first input coupled to a reference voltage VREF and a second input coupled to pin 212. ADC 217 generates digital calibration codes RP[N:0] in response to the outputs of comparators 214-216. Each bit in calibration code RP[N:0] turns one of the transistors in group 213 on or off. Comparators 214-216 and ADC 217 form a feedback loop coupled to transistor group 213.

Figure 2D:
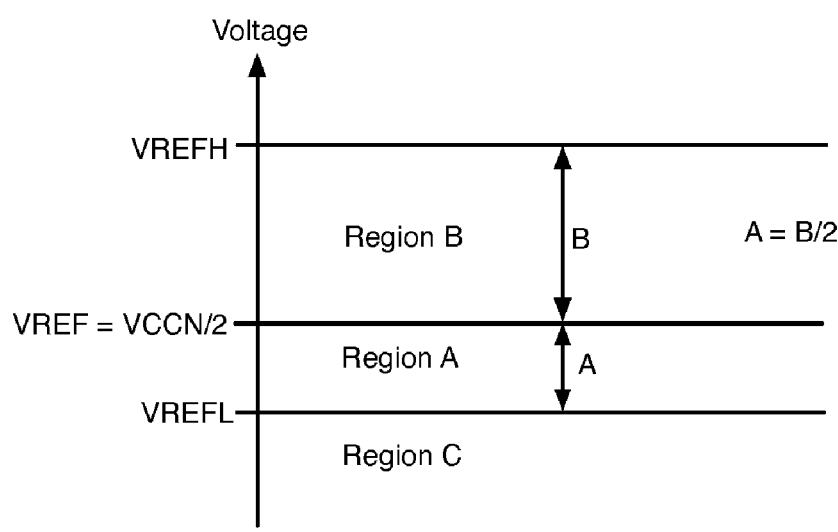
FIG. 2D is graph that shows relative values of the reference voltages used in an example implementation of the embodiment of FIG. 2B.

FIG. 2D illustrates one example of the relative voltage values of VREF, VREFH, and VREFL for the calibration circuit portion 210 shown in FIG. 2B. In FIG. 2D, the difference B between VREFH and VREF is twice the difference A between VREF and VREFL. Thus, A=B/2. According to further embodiments, other ratios between difference A and difference B can be used, e.g., 1:3, 1:1.5, 1:1, etc.

One example implementation of FIG. 2B that is based on the relative reference voltages of FIG. 2D (A=B/2) will now be described. The calibration code RP[N:0] is initially all ones, causing all of the transistors in group 213 to be off, and the pin voltage to equal ground. ADC 217 begins by decreasing the binary values of the calibration codes RP[N:0], causing more current to flow through transistors 213 and causing the pin voltage to increase.

As the pin voltage rises, ADC 217 analyzes the output signals of comparators 215 and 216 to determine if any of the calibration codes cause the output signals of comparators 215 and 216 to be in different states. The output signals of comparators 215 and 216 are in different states when the pin voltage is between VREF and VREFL. A calibration code RP[N:0] that corresponds to a pin voltage falling between VREF and VREFL is preferentially selected to control the OCT in one or more I/O buffers.

If one of the calibration codes does not generate a pin voltage between VREF and VREFL, ADC 217 determines if any of the calibration codes generates a pin voltage between VREFH and VREF. The pin voltage is between VREFH and VREF when the outputs of comparators 214 and 216 are in different states. If a calibration code RP[N:0] generates a pin voltage between VREFH and VREF, that calibration code is selected to control the OCT in one or more I/O buffers.

If a pin voltage is not found between VREFH and VREFL, then the nearest pin voltage in region C is selected to control the OCT in one or more I/O buffers. Region C includes all voltages that are below VREFL. ADC 217 can subtract one or more from the calibration code to backtrack to the highest pin voltage in Region C.

In this situation, the nearest pin voltage in region C is the closest pin voltage to VREF, assuming that the difference between two successive pin voltages (one below VREF and one above VREF) is less than twice B. With this assumption, the difference between VREF and the nearest point above VREF is greater than B, and a difference between VREF and the nearest pin voltage in Region C is less than B. This technique can select a pin voltage closer to VREF that results in a better tolerance level for the OCT resistance (e.g., +/−5% of off-chip resistor 211) than the embodiment of FIGS. 1A-1B.

Figure 3A:
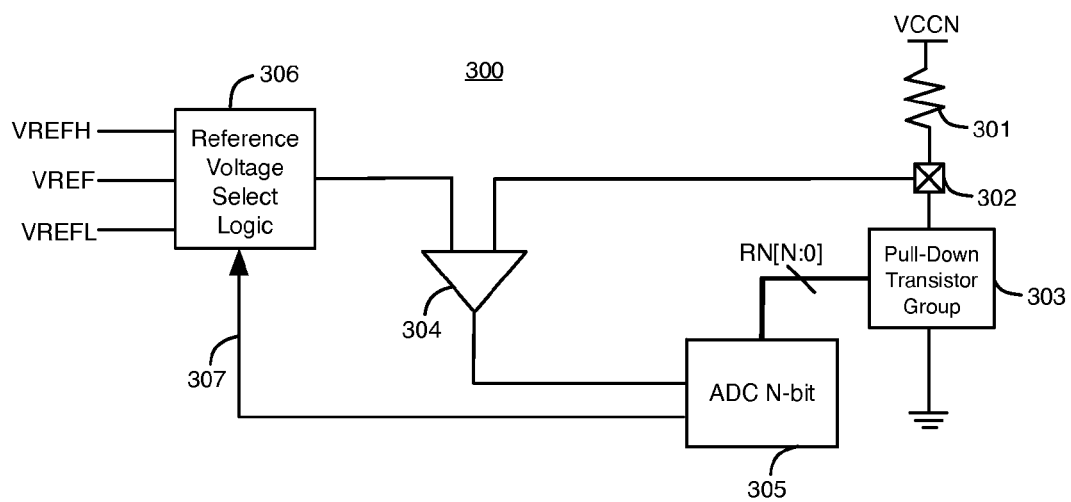
FIG. 3A illustrates a pull-down portion of an on-chip termination (OCT) calibration circuit that compares a voltage at a pin to three reference voltages using one comparator and reference voltage select logic, according to an embodiment of the present invention.
Figure 3B:
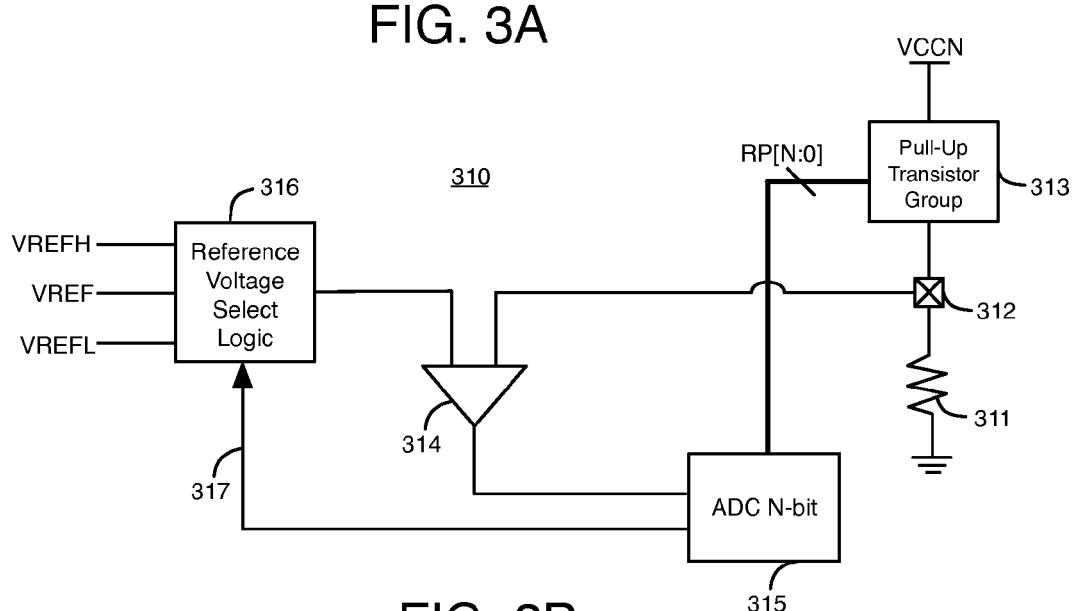
FIG. 3B illustrates a pull-up portion of an on-chip termination (OCT) calibration circuit that compares a voltage at a pin to three reference voltages using one comparator and reference voltage select logic, according to an embodiment of the present invention.

Comparators are analog circuit blocks that can take up a large die area and consume a significant amount of power when in operation. Additional embodiments of the present invention address these issues by reducing the number of comparators. One of these embodiments is shown in FIGS. 3A-3B. FIGS. 3A-3B illustrate a pull-down portion 300 and a pull-up portion 310 of an OCT calibration circuit.

Referring to FIG. 3A, pull-down portion 300 includes a pin 302, reference voltage select logic 306, a single comparator 304, an N-bit analog-to-digital converter (ADC) 305, and a group of pull-down transistors 303. Pin 302 is coupled to off-chip resistor 301. Transistor group 303 includes any number N of binary-weighted pull-down transistors (e.g., NMOS field-effect transistors) that are coupled together in parallel.

Reference voltage select logic 306 has three input terminals that are coupled to receive three different reference voltages, VREFH, VREF, and VREFL. Logic 306 can be, for example, a multiplexer. Instead of using three comparators to compare the voltage at pin 302 to three reference voltages, portion 300 has one comparator 304 that is used to compare the pin voltage to the three reference voltages.

Comparator 304 has one input that is coupled to pin 302 and another input coupled to receive a reference voltage from logic 306. Logic 306 shifts the reference voltage received at comparator 304, enabling comparator 304 to compare the voltage at pin 302 to the three different reference voltages (VREF, VREFH, and VREFL). Logic 306 outputs different reference voltages in response to control signals on bus 307.

ADC 305 adjusts the calibration codes RN[N:0] in response to the output signal of comparator 304. Using the outputs of comparator 304 at the different reference voltages, ADC 305 can determine when the pin voltage falls between VREF and VREFH or between VREF and VREFL.

According to one example implementation of FIG. 3A, the difference between VREFH and VREF is half the difference between VREF and VREFL as shown in FIG. 2C. This implementation is now described, although other ratios between the reference voltages can also be used.

The calibration code is initially all zeros, and the pin voltage is at VCCN. ADC 305 begins by increasing the binary values of the calibration codes RN[N:0], causing the pin voltage to decrease. Logic 306 couples VREFH to an input of comparator 304 until the output signal of comparator 304 changes state when the pin voltage crosses VREFH.

When the output signal of comparator 304 changes state, a state machine inside ADC 305 generates a control signal on bus 307 that causes logic 306 to couple VREF to the input of comparator 304. In response to the output signal of comparator 304 at the two different reference voltages, ADC 305 determines if one of the calibration codes generates a pin voltage between VREFH and VREF.

If one of the calibration codes RN[N:0] generates a pin voltage between VREFH and VREF, that calibration code is sent to the I/O buffers, and the calibration process terminates. If one of the calibration codes does not generate a pin voltage between VREFH and VREF, the binary values of the calibration codes continue to increase.

After the output signal of comparator 304 changes state a second time (when the pin voltage crosses VREF), the state machine in ADC 305 generates a second control signal on bus 307 that causes logic 306 to couple VREFL to the input of comparator 304. ADC 305 can now determine if one of the calibration codes generates a pin voltage between VREF and VREFL. If one of the calibration codes generates a pin voltage between VREF and VREFL, that calibration code is sent to the I/O buffers, and the calibration process terminates.

If none of the calibration codes generates a pin voltage between VREFH and VREFL, ADC 305 decreases the calibration code to the value that generates the nearest pin voltage above VREFH, and that calibration code is sent to the I/O buffers. This embodiment of the present invention can achieve a tolerance range for the on-chip termination resistance of +/−5% of off-chip resistor 301.

The pull-up portion 310 of the calibration circuit functions in a similar manner. Referring to FIG. 3B, pull-up portion 310 includes a pin 312, reference voltage select logic 316, a single comparator 314, an N-bit analog-to-digital converter (ADC) 315, and a group of pull-up transistors 313. Pin 312 is coupled to off-chip resistor 311. Transistor group 313 includes any number N of binary-weighted pull-up transistors (e.g., PMOS field-effect transistors) that are coupled together in parallel.

Reference voltage select logic 316 has three input terminals that are coupled to receive three different reference voltages, VREFH, VREF, and VREFL. Comparator 314 has one input that is coupled to pin 312 and another input coupled to receive a reference voltage from logic 316. As with the embodiment of FIG. 3A, logic 316 shifts the reference voltage received at comparator 314, enabling comparator 314 to compare the voltage at pin 312 to the three different reference voltages (VREF, VREFH, and VREFL). Logic 316 can be, for example, a multiplexer.

According to one implementation of FIG. 3B, the difference between VREF and VREFL is half the difference between VREFH and VREF as shown in FIG. 2D. This implementation is now described, although other ratios between the references voltages can also be used.

The calibration code RP[N:0] is initially all ones, and the pin voltage is at ground. ADC 315 begins by decreasing the binary values of the calibration codes RP[N:0], causing the pin voltage to increase. Logic 316 couples VREFL to an input of comparator 314, until the output signal of comparator 314 changes state when the pin voltage crosses VREFL.

When the output signal of comparator 314 changes state, a state machine inside ADC 315 generates a control signal on bus 317 that causes logic 316 to couple VREF to the input of comparator 314. In response to the output signal of comparator 314 at the two different reference voltages, ADC 315 determines if one of the calibration codes generates a pin voltage between VREF and VREFL.

If one of the calibration codes RP[N:0] generates a pin voltage between VREF and VREFL, that calibration code is sent to the I/O buffers. If one of the calibration codes does not generate a pin voltage between VREF and VREFL, the binary values of the calibration codes continue to decrease.

After the output signal of comparator 314 changes state a second time (when the pin voltage crosses VREF), the state machine in ADC 315 generates a second control signal on bus 317 that causes logic 316 to couple VREFH to the input of comparator 314. ADC 315 can now determine if one of the calibration codes RP[N:0] generates a pin voltage between VREFH and VREF. If one of the calibration codes generates a pin voltage between VREFH and VREF, that calibration code is sent to the I/O buffers.

If none of the calibration codes generates a pin voltage between VREFH and VREFL, ADC 315 increases the calibration code RP[N:0] to the value that generates the nearest pin voltage below VREFL, and that calibration code is sent to the I/O buffers. This embodiment of the present invention can achieve a tolerance range for the on-chip termination resistance of +/−5% of off-chip resistor 311.

Figure 3C:
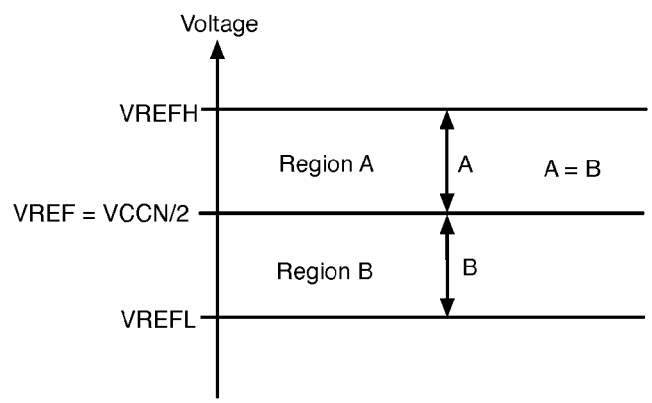
FIG. 3C is a graph that shows relative values of the reference voltages used in an example implementation of the embodiment of FIGS. 3A-3B.

According to another embodiment of the present invention that is shown in FIG. 3C, the difference between VREFH and VREF equals the difference between VREF and VREFL. In the embodiment of FIG. 3C, OCT calibration circuit portion 300 selects the calibration code RN[N:0] that generates a pin voltage between VREFH and VREFL to control the pull-down on-chip termination impedance. OCT calibration circuit portion 310 selects the calibration code RP[N:0] that generates a pin voltage between VREFH and VREFL to control the pull-up on-chip termination impedance. If none of the calibration codes generate a pin voltage between VREFH and VREFL, a calibration code that generates a pin voltage just below VREFL or just above VREFH is selected to control the on-chip termination impedance. This embodiment can generate a tolerance range for the on-chip termination resistances of +/−10% of the off-chip resistor values.

Figure 4A:
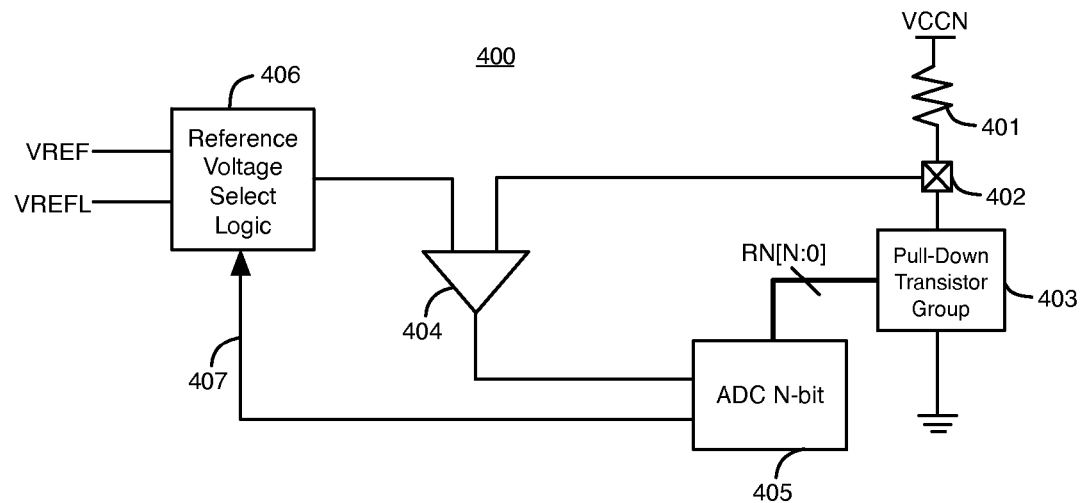
FIG. 4A illustrates a pull-down portion of an on-chip termination (OCT) calibration circuit that compares a voltage at a pin to two reference voltages using one comparator and reference voltage select logic, according to an embodiment of the present invention.
Figure 4B:
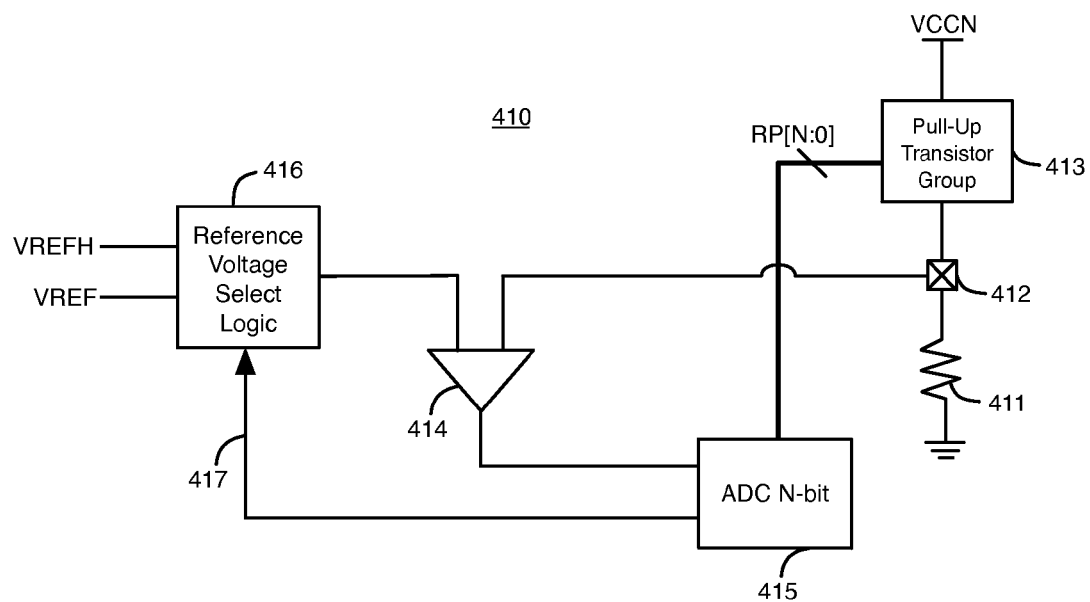
FIG. 4B illustrates a pull-up portion of an on-chip termination (OCT) calibration circuit that compares a voltage at a pin to two reference voltages using one comparator and reference voltage select logic, according to an embodiment of the present invention.

The embodiments of FIGS. 1A-1D can also be modified to reduce the number of comparators, as shown in FIGS. 4A-4B. FIGS. 4A-4B illustrate a pull-down portion 400 and a pull-up portion 410 of an OCT calibration circuit, according to another embodiment of the present invention.

Referring to FIG. 4A, pull-down portion 400 includes a pin 402, reference voltage select logic 406, a single comparator 404, an N-bit analog-to-digital converter (ADC) 405, and a group of pull-down transistors 403. Pin 402 is coupled to off-chip resistor 401. Transistor group 403 includes any number N of binary-weighted pull-down transistors (e.g., NMOS field-effect transistors) that are coupled together in parallel.

Reference voltage select logic 406 has two input terminals that are coupled to receive two different reference voltage values, VREF and VREFL. Logic 406 can be, for example, a multiplexer. Instead of using two comparators to compare the voltage at pin 402 with two reference voltages, portion 400 has only one comparator 404 that is used to compare the pin voltage to the two reference voltages. Comparator 404 has one input that is coupled to pin 402 and another input coupled to receive a reference voltage from logic 406. Logic 406 shifts the reference voltage received at comparator 404, enabling comparator 404 to compare the voltage at pin 402 to the two reference voltages.

The calibration code RN[N:0] is initially all zeros, and the pin voltage is at VCCN. ADC 405 begins by increasing the binary values of the calibration codes, causing the pin voltage to decrease. Logic 406 couples VREF to an input of comparator 404 until the output signal of comparator 404 changes state when the pin voltage crosses VREF.

When the output signal of comparator 404 changes state, a state machine inside ADC 405 generates a control signal on wire 407 that causes logic 406 to couple VREFL to the input of comparator 404. In response to the output signal of comparator 404 at the two different reference voltages, ADC 405 can determine if one of the calibration codes generates a pin voltage between VREF and VREFL. If one of the calibration codes RN[N:0] generates a pin voltage between VREF and VREFL, that calibration code is selected to control the on-chip termination impedance in one or more I/O buffers.

Figure 4C:
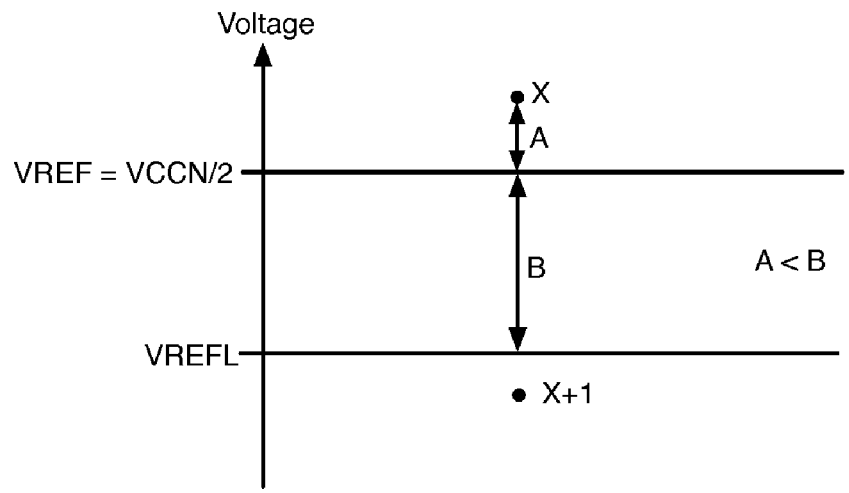
FIG. 4C is a graph that shows two pin voltages near two reference voltages, according to an example implementation of the embodiment of FIG. 4A.

If one of the calibration codes does not generate a pin voltage between VREF and VREFL, the OCT calibration circuit selects the calibration code that generates the nearest pin voltage to VREF. FIG. 4C shows the relative locations of VREF and VREFL for portion 400 and two pin voltages, at points X and X+1, that are generated in response to two successive calibration codes RN[N:0]. If the difference D1 between the voltages at point X+1 and point X is less than twice the voltage difference B between VREF and VREFL, point X is closer to VREF than point X+1.

If one of the calibration codes does not generate a pin voltage between VREF and VREFL and D1<2*B, the calibration code that generates the pin voltage at point X is selected to control the on-chip termination impedance in one or more I/O buffers. If point X+1 is between VREF and VREFL, the calibration code generating the pin voltage at point X+1 is selected and sent to the I/O buffers, even if point X is closer to VREF.

Referring to FIG. 4B pull-up portion 410 includes a pin 412, reference voltage select logic 416, a single comparator 414, an N-bit analog-to-digital converter (ADC) 415, and a group of pull-up transistors 413. Pin 412 is coupled to an off-chip resistor 411. Transistor group 413 includes any number N of binary-weighted pull-up transistors (e.g., PMOS field-effect transistors) that are coupled together in parallel.

Reference voltage select logic 416 has two input terminals that are coupled to receive two different reference voltage values, VREF and VREFH. Logic 416 can be, for example, a multiplexer. Instead of using two comparators to compare the voltage at pin 412 with two reference voltages, portion 410 has only one comparator 414 that is used to compare the pin voltage to the two reference voltages. Comparator 414 has one input that is coupled to pin 412 and another input coupled to receive a reference voltage from logic 416. Logic 416 shifts the reference voltage received at comparator 414, enabling comparator 414 to compare the voltage at pin 412 to the two reference voltages.

The calibration code RP[N:0] is initially all ones, and the pin voltage is at ground. ADC 415 begins by decreasing the binary values of the calibration codes, causing the pin voltage to increase. Logic 416 couples VREF to an input of comparator 414 until the output signal of comparator 414 changes state when the pin voltage crosses VREF.

When the output signal of comparator 414 changes state, a state machine inside ADC 415 generates a control signal on wire 417 that causes logic 416 to couple VREFH to the input of comparator 414. In response to the output signal of comparator 414 at the two different reference voltages, ADC 415 is able to determine if one of the calibration codes RP[N:0] generates a pin voltage between VREFH and VREF. If one of the calibration codes generates a pin voltage between VREFH and VREF, that calibration code is selected to control the on-chip termination impedance in one or more I/O buffers.

Figure 4D:
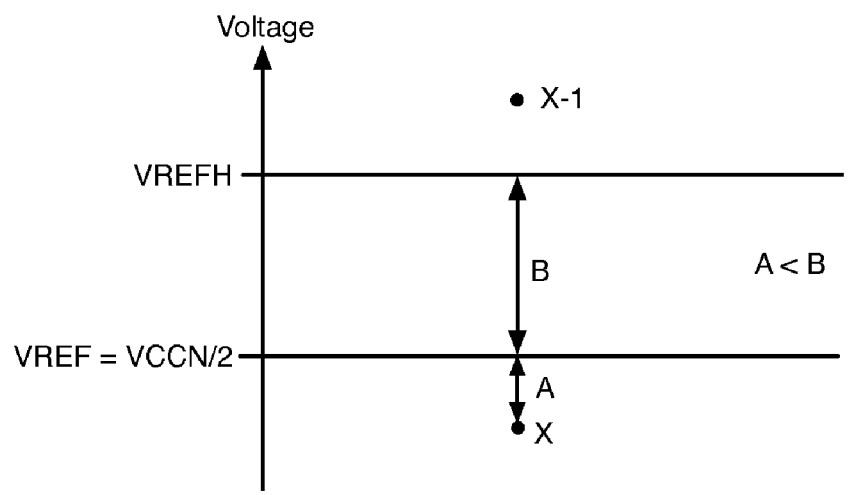
FIG. 4D is a graph that shows two pin voltages near two reference voltages, according to an example implementation of the embodiment of FIG. 4B.

If one of the calibration codes does not generate a pin voltage between VREFH and VREF, the OCT calibration circuit selects the calibration code that generates the nearest pin voltage to VREF. FIG. 4D shows the relative locations of VREFH and VREF for portion 410 and two pin voltages, at points X and X−1, that are generated in response to two successive calibration codes RP[N:0]. If the difference D2 between the voltages at point X−1 and point X is less than twice the voltage difference B between VREFH and VREF, point X is closer to VREF than point X−1.

If one of the calibration codes does not generate a pin voltage between VREFH and VREF and D2<2*B, the calibration code that generates the pin voltage at point X is selected to control the on-chip termination impedance in the I/O buffers. If point X−1 is between VREFH and VREF, the calibration code that generates the pin voltage at point X−1 is selected to control the on-chip termination impedance in the I/O buffers, even if point X is closer to VREF. In FIGS. 4A and 4B, voltage difference B is greater than voltage difference A.

The embodiment of FIGS. 4A-4B can provide a tolerance range for the on-chip termination resistances of +/−10% of the off-chip resistor values by appropriate selection of the differences between VREF, VREFL, and VREFH, as well as the smallest transistor sizes in the OCT calibration circuit and the input/output buffers.

In some embodiments of the present invention, each reference voltage select logic circuit receives more than 3 reference voltages. OCT calibration circuits of the present invention can receive any number of reference voltages to obtain a desired tolerance range with only one comparator.

Figure 5A:
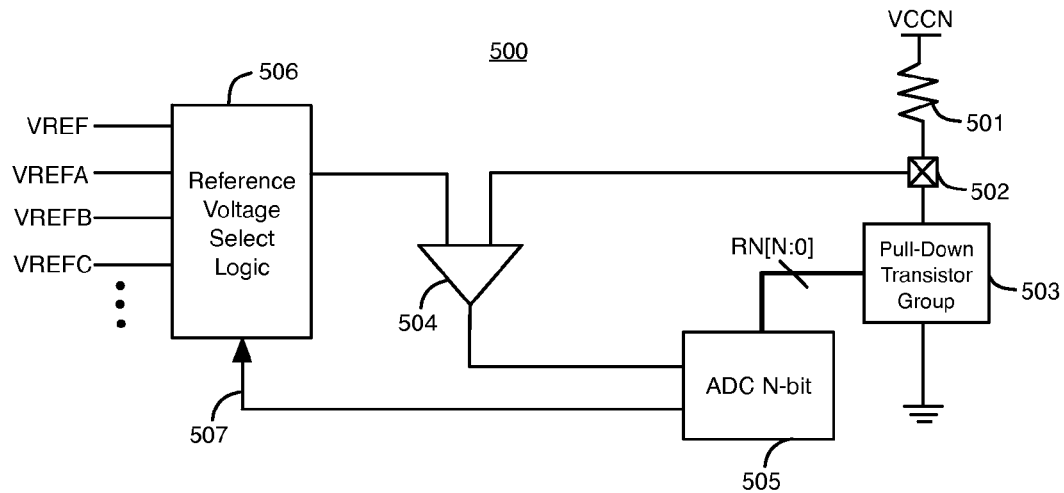
FIG. 5A illustrates a pull-down portion of an on-chip termination (OCT) calibration circuit that compares a voltage at a pin to four or more reference voltages using one comparator and reference voltage select logic, according to an embodiment of the present invention.
Figure 5B:
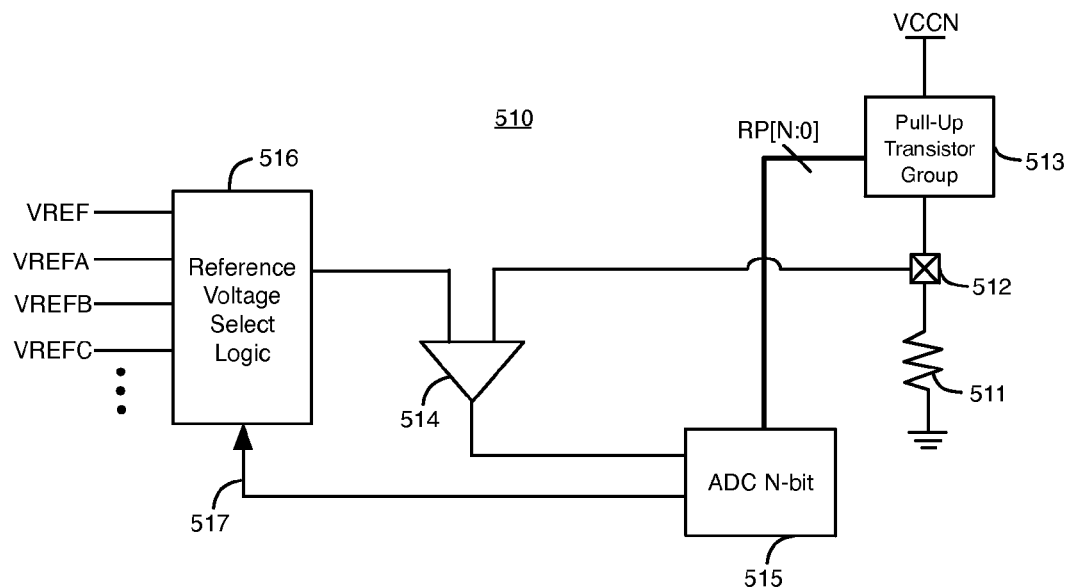
FIG. 5B illustrates a pull-up portion of an on-chip termination (OCT) calibration circuit that compares a voltage at a pin to four or more reference voltages using one comparator and reference voltage select logic, according to an embodiment of the present invention.

FIGS. 5A-5B illustrate an example of OCT calibration circuit block designed according to a further embodiment of the present invention. The OCT calibration circuit block includes a pull-down portion 500 shown in FIG. 5A and a pull-up portion 510 shown in FIG. 5B.

Portion 500 includes a pin 502, an N number of binary-weighted pull-down transistors in group 503, comparator 504, an N-bit analog-to-digital converter (ADC) 505, and reference voltage select logic 506. Pin 502 is coupled to off-chip resistor 501. ADC 505 selectively turns transistors in group 503 on or off using calibration code RN[N:0]. The ADC and comparator form a feedback loop. Reference voltage select logic 506 selectively couples four (or more) reference voltages (VREF, VREFA, VREFB, VREFC, etc.) to an input of comparator 504 at different times. Logic 506 selects a different reference voltage to couple to comparator 504 in response to control signals from a state machine in ADC 505 that are transmitted on bus 507.

Figure 5C:
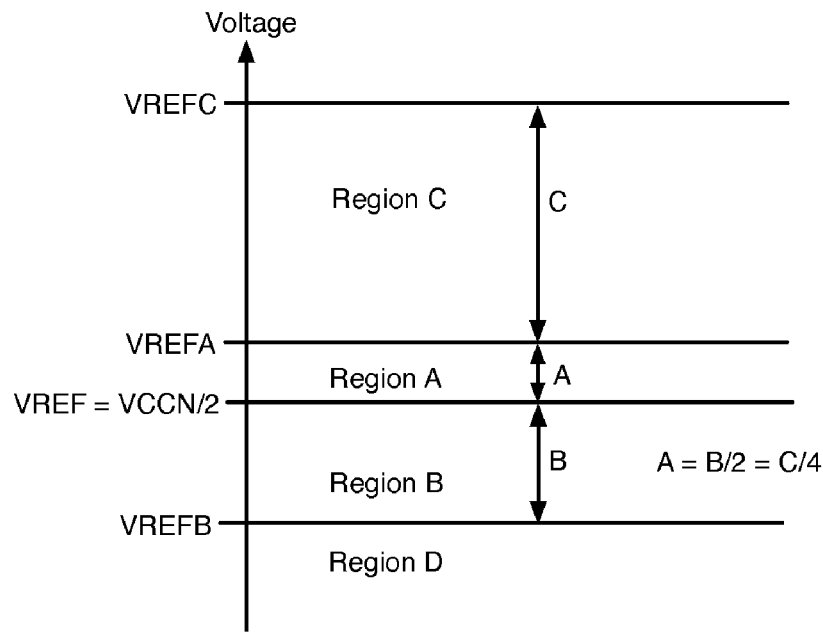
FIG. 5C is a graph that shows relative values of the reference voltages used in an example implementation of the embodiment of FIG. 5A.

FIG. 5C illustrates an example of the relative voltage values of 4 reference voltages VREF, VREFA, VREFB, and VREFC, according to an example implementation of calibration circuit portion 500. In FIG. 5C, the difference A between VREF and VREFA is half the difference B between VREF and VREFB, and B is half the difference C between VREFA and VREFC. Thus, A=B/2=C/4.

Region A between VREF and VREFA is the narrowest range among the various reference voltages. Therefore, if ADC 505 determines that one of the calibration codes RN[N:0] generates a pin voltage in region A, that calibration code is selected to control the on-chip termination impedance in one or more I/O buffers.

Region B between VREF and VREFB is the second narrowest range among the various reference voltages. If ADC 505 determines that one of the calibration codes RN[N:0] generates a pin voltage in region B (but not in region A), that calibration code is selected to control the on-chip termination impedance in one or more I/O buffers.

Region C between VREFA and VREFC is the third narrowest range among the various reference voltages. If ADC 505 determines that one of the calibration codes RN[N:0] generates a pin voltage in region C (but not in regions A or B), that calibration code is selected to control the on-chip termination impedance in one or more I/O buffers.

If ADC 505 determines that one of the calibration codes RN[N:0] does not generate a pin voltage between VREFB and VREFC, the calibration code generating a pin voltage in region D that is closest to VREF is selected to control the on-chip termination impedance in one or more I/O buffers. The selected calibration code is the smallest calibration code that occurs in region D.

Referring now to FIG. 5B, portion 510 includes a pin 512, an N number of binary-weighted pull-up transistors in group 513, comparator 514, an N-bit analog-to-digital converter (ADC) 515, and reference voltage select logic 516. Pin 512 is coupled to off-chip resistor 511. ADC 515 selectively turns transistors in group 513 on or off using calibration code RP[N:0]. The ADC and comparator form a feedback loop. Reference voltage select logic 516 selectively couples four (or more) reference voltages (VREF, VREFA, VREFB, VREFC, etc.) to an input of comparator 514 at different times. Logic 516 selects a different reference voltage to couple to comparator 514 in response to control signals from a state machine in ADC 515 that are transmitted on bus 517.

Figure 5D:
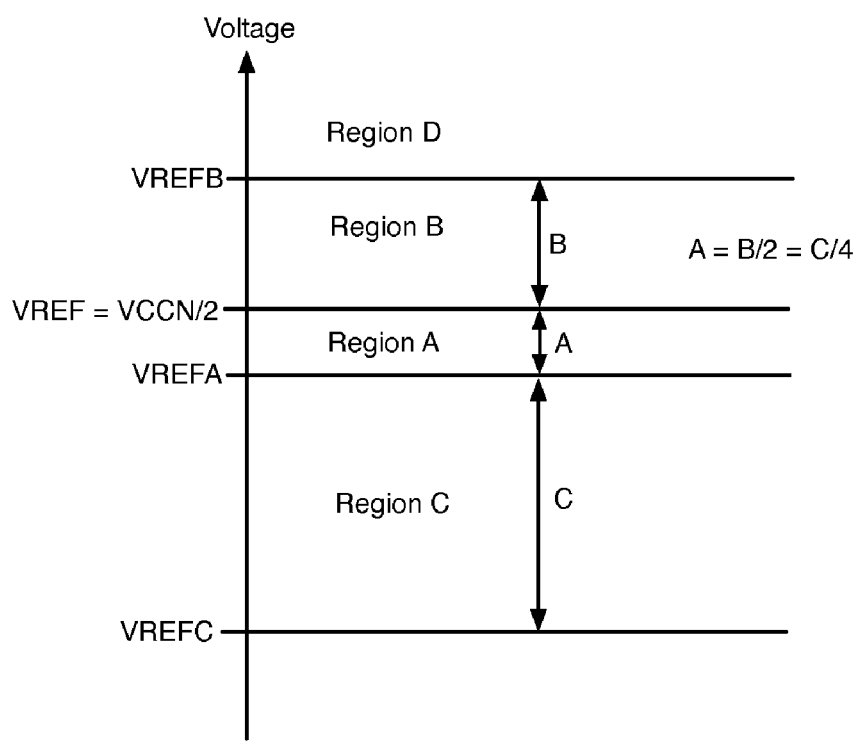
FIG. 5D is graph that shows relative values of the reference voltages used in an example implementation of the embodiment of FIG. 5B.

FIG. 5D illustrates an example of the relative voltage values of 4 reference voltages VREF, VREFA, VREFB, and VREFC, according to an example implementation of calibration circuit portion 510. In FIG. 5D, the difference A between VREF and VREFA is half the difference B between VREF and VREFB, and B is half the difference C between VREFA and VREFC. Thus, A=B/2=C/4.

Region A between VREF and VREFA is the narrowest range among the various reference voltages. Therefore, if ADC 515 determines that one of the calibration codes RP[N:0] generates a pin voltage in region A, that calibration code is selected to control the on-chip termination impedance in one or more I/O buffers.

Region B between VREF and VREFB is the second narrowest range among the various reference voltages. If ADC 515 determines that one of the calibration codes RP[N:0] generates a pin voltage in region B (but not in region A), that calibration code is selected to control the on-chip termination impedance in one or more I/O buffers.

Region C between VREFA and VREFC is the third narrowest range among the various reference voltages. If ADC 515 determines that one of the calibration codes RP[N:0] generates a pin voltage in region C (but not in regions A or B), that calibration code is selected to control the on-chip termination impedance in one or more I/O buffers.

If ADC 515 determines that a stable pin voltage does not exist between VREFB and VREFC, the calibration code generating a pin voltage in region D that is closest to VREF is selected to control the on-chip termination impedance in one or more I/O buffers. The selected calibration code is the largest calibration code that occurs in region D.

Instead of using extra reference voltages such as VREFL and/or VREFH, an extra transistor can be added to each OCT calibration circuit block to locate the calibration code that results in the closest pin voltage to VREF. An OCT calibration circuit that contains extra transistors according to this embodiment of the present invention is illustrated in FIGS. 6A-6B.

Each extra transistor in an OCT calibration circuit is sized so that a voltage change caused by the extra transistor turning on is half the voltage change caused by the smallest transistor in an I/O buffer controlled by that OCT calibration circuit. The extra transistor is used to determine which calibration code generates a pin voltage closest to VREF. A corresponding extra transistor can be added to each I/O buffer to achieve the same result, but the extra transistor increases I/O buffer area and pin capacitance, which is undesirable.

Figure 6A:
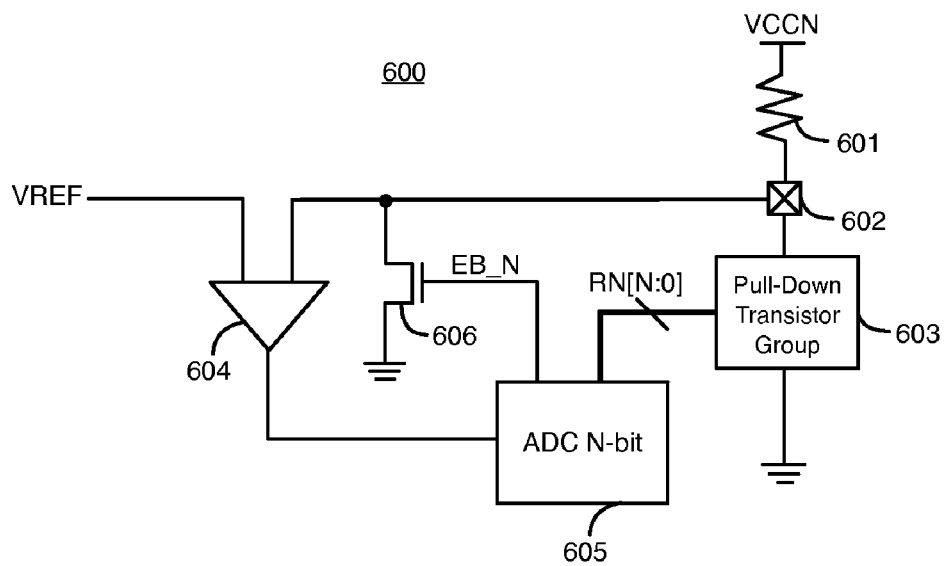
FIG. 6A illustrates a pull-down portion of an on-chip termination (OCT) calibration circuit that includes an extra pull-down transistor, according to an embodiment of the present invention.
Figure 6B:
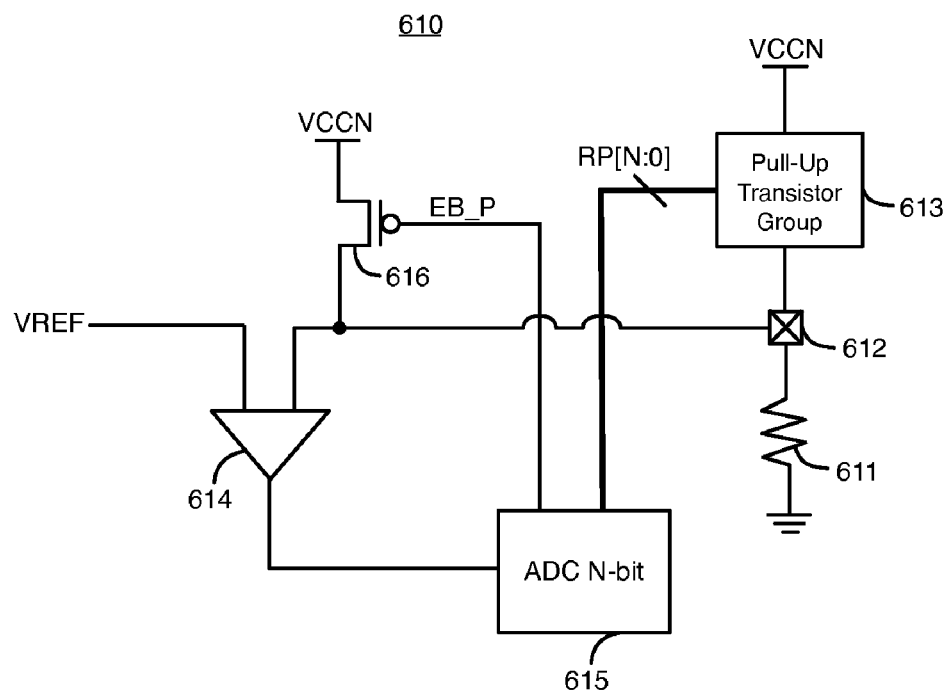
FIG. 6B illustrates a pull-up portion of an on-chip termination (OCT) calibration circuit that includes an extra pull-up transistor, according to an embodiment of the present invention.

FIG. 6A illustrates a pull-down portion 600 of an OCT calibration circuit block that includes a pin 602, an N number of parallel-coupled, binary weighted pull-down transistors in group 603, a comparator 604, an analog-to-digital converter (ADC) 605, and a pull-down transistor 606 (e.g., an NMOS field-effect transistor). Pin 602 is coupled to off-chip resistor 601. Comparator 604 has one input coupled to pin 602 and a second input coupled to receive reference voltage VREF.

ADC 605 generates calibration codes RN[N:0] having digital bits. Each bit in the calibration code turns one of the individual transistors in group 603 on or off. As with the previous embodiments, the comparator and ADC of FIG. 6A form a feedback loop. ADC 605 varies the binary values of the calibration codes RN[N:0] to achieve a voltage at pin 602 that is as close to VREF as possible.

NMOS transistor 606 is the extra transistor referred to above. The gate of transistor 606 is coupled to receive a control signal EB_N from ADC 605, the drain of transistor 606 is coupled to pin 602, and the source of transistor 606 is coupled to ground. Thus, transistor 606 is coupled in parallel with the transistors in group 603. The control signal EB_N from ADC 605 turns transistor 606 on or off. When ADC 605 turns transistor 606 on, the voltage generated at pin 602 decreases, while the binary value of the calibration code RN[N:0] remains constant.

The size of transistor 606 is selected so that turning transistor 606 on causes a voltage change at pin 602 that equals one-half the voltage change at pin 602 caused by turning on the smallest pull-down transistor in group 603.

Initially, the calibration code RN[N:0] is all zeros, and the pin voltage equals VCCN. ADC 605 increases the binary values of the calibration codes until the pin voltage drops below VREF at a point X+1. Then, ADC 605 decreases the calibration code by one to generate a pin voltage at point X, and ADC 605 turns on transistor 606.

Figure 6C:
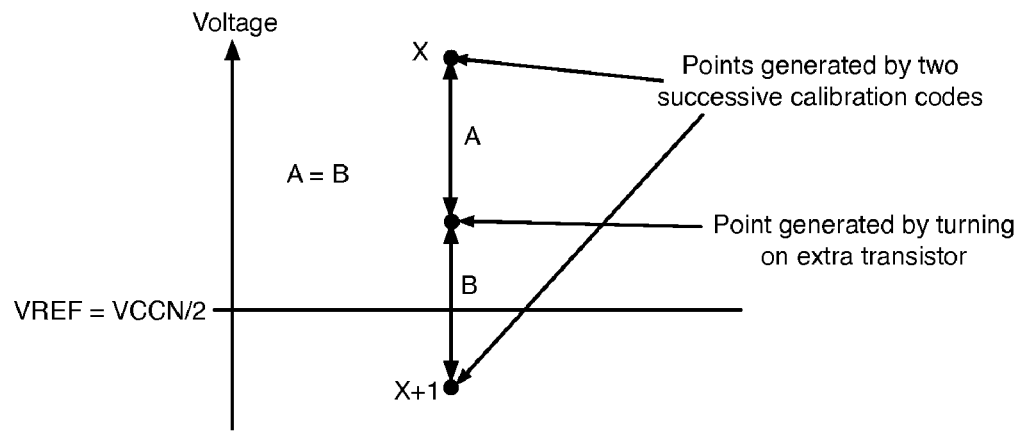
FIG. 6C is a graph that shows three pin voltages near a reference voltage, according to an example implementation of the embodiment of FIG. 6A.

FIG. 6C shows examples of the pin voltages at point X and point X+1 that are generated in response to two successive calibration codes RN[N:0]. Points X and X+1 are the closest pin voltages to VREF. FIG. 6C also shows a pin voltage obtained when extra transistor 606 is turned on after a calibration code has generated point X at pin 602. In the example of FIG. 6C, point X+1 is closer to VREF than point X.

Turning on transistor 606 when the pin voltage is at point X moves the pin voltage to the mid-point between point X and point X+1 (A=B). By sensing the output of comparator 604, ADC 605 is able to determine whether the pin voltage is above or below VREF when transistor 606 is on and the calibration code is the same value that generates point X.

If the pin voltage is above VREF when transistor 606 is on, then point X+1 is closer to VREF than point X, as shown in FIG. 6C, and the calibration code that generates point X+1 is selected to control the on-chip termination impedance in one or more I/O buffers. If the pin voltage is below VREF when transistor 606 on, then point X is closer to VREF than X+1, and the calibration code RN[N:0] that generates point X is selected to control the on-chip termination impedance in the I/O buffer(s). The control signal EB_N is not transmitted to the I/O buffers and is not used to control the termination impedance in the I/O buffers. The embodiment of FIG. 6A can achieve a tolerance range for the on-chip termination resistance of +/−5% of off-chip resistor 601.

FIG. 6B illustrates a pull-up portion 610 of an OCT calibration circuit block that includes a pin 612, an N number of parallel-coupled, binary weighted pull-up transistors in group 613, a comparator 614, an analog-to-digital converter (ADC) 615, and a pull-up transistor 616 (e.g., a PMOS field-effect transistor). Pin 612 is coupled to an off-chip resistor 611. Comparator 614 has one input coupled to pin 612 and a second input coupled to receive reference voltage VREF.

ADC 615 generates calibration codes RP[N:0] having digital bits. Each bit in the calibration code turns one of the individual transistors in group 613 on or off. As with the previous embodiments, the comparator and ADC of FIG. 6B form a feedback loop. ADC 615 varies the binary values of the calibration codes RP[N:0] to achieve a voltage at pin 612 that is as close to VREF as possible.

PMOS transistor 616 is an extra transistor. The gate of transistor 616 is coupled to receive a control signal EB_P from ADC 615, the drain of transistor 616 is coupled to pin 612, and the source of transistor 616 is coupled to supply voltage VCCN. Thus, transistor 616 is coupled in parallel with the transistors in group 613. The control signal EB_P from ADC 615 turns transistor 616 on or off. When ADC 615 turns transistor 616 on, the voltage generated at pin 612 increases, while the binary value of the calibration code RP[N:0] remains constant.

The size of transistor 616 is selected so that turning transistor 616 on causes a voltage change at pin 612 that equals one-half the voltage change at pin 612 caused by turning on the smallest pull-up transistor in group 613.

Initially, the calibration code RP[N:0] is all ones, and the pin voltage equals ground. ADC 615 decreases the binary values of the calibration codes until the pin voltage rises above VREF at a point X−1. Then, ADC 615 increases the calibration code by 1 to generate a pin voltage at point X, and ADC 615 turns on transistor 616.

Figure 6D:
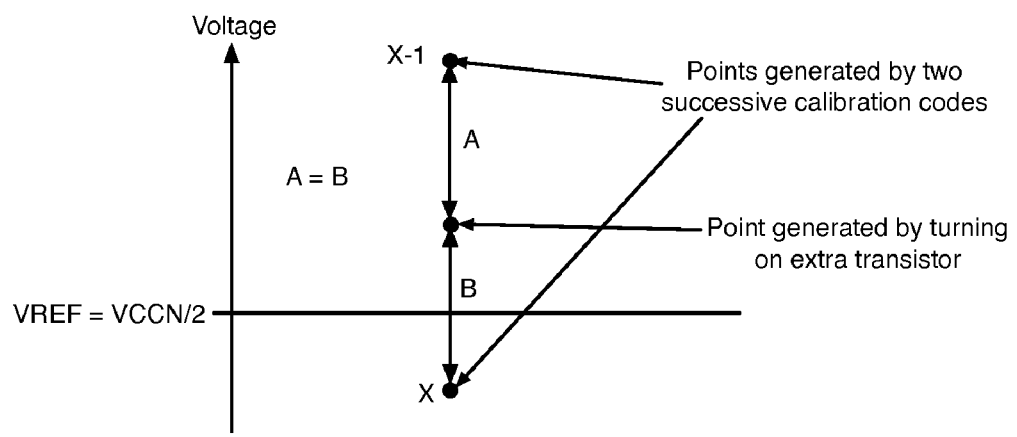
FIG. 6D is a graph that shows three pin voltages near a reference voltage, according to an example implementation of the embodiment of FIG. 6B.

FIG. 6D shows examples of the pin voltages at point X and point X−1 that are generated in response to two successive calibration codes RP[N:0]. Points X and X−1 are the closest pin voltages to VREF. FIG. 6D also shows a pin voltage obtained when extra transistor 616 is turned on after a calibration code has generated point X at pin 612. In the example of FIG. 5D, point X−1 is farther away from VREF than point X.

Turning on transistor 616 when the pin voltage is at point X moves the pin voltage to the mid-point between point X and point X−1 (A=B). By sensing the output of comparator 614, ADC 615 is able to determine whether the pin voltage is above or below VREF when transistor 616 is on and the calibration code is the same value that generates point X.

If ADC 615 determines that the pin voltage increases above VREF with transistor 616 on, then point X is closer to VREF than point X−1, as shown in FIG. 6D, and the calibration code that generates point X is selected to control the on-chip termination impedance in one or more I/O buffers. If ADC 615 determines that the pin voltage is below VREF with transistor 616 on, then point X−1 is closer to VREF than point X, and the calibration code that generates point X−1 is selected to control the on-chip termination impedance in one or more I/O buffers. The control signal EB_P is not transmitted to the I/O buffers and is not used to control the on-chip termination in the I/O buffers. The embodiment of FIG. 6B can achieve a tolerance range for the on-chip termination resistance of +/−5% of off-chip resistor 611.

Figure 7A:
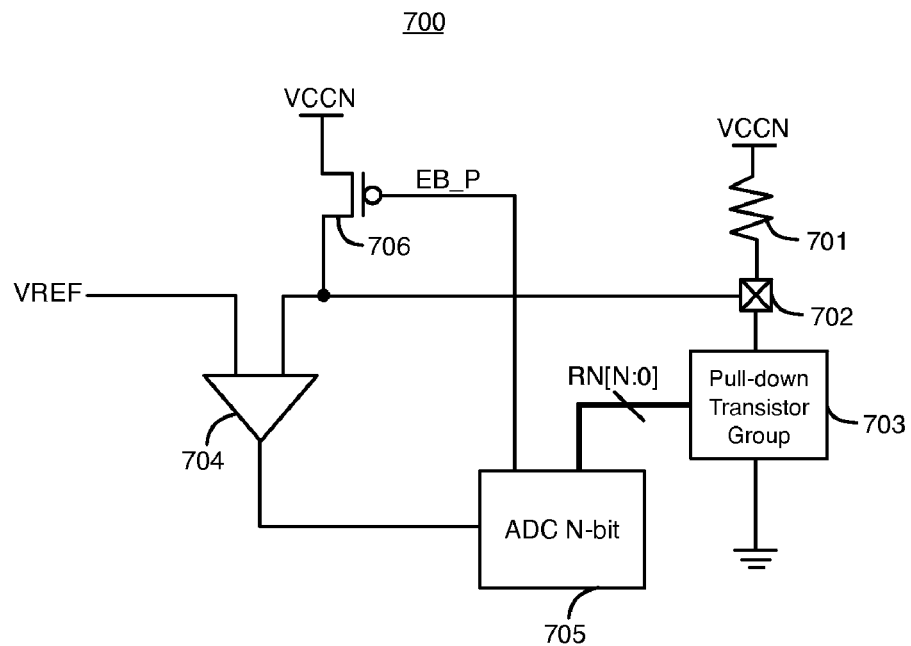
FIG. 7A illustrates a pull-down portion of an on-chip termination (OCT) calibration circuit that includes an extra pull-up transistor, according to an embodiment of the present invention.
Figure 7B:
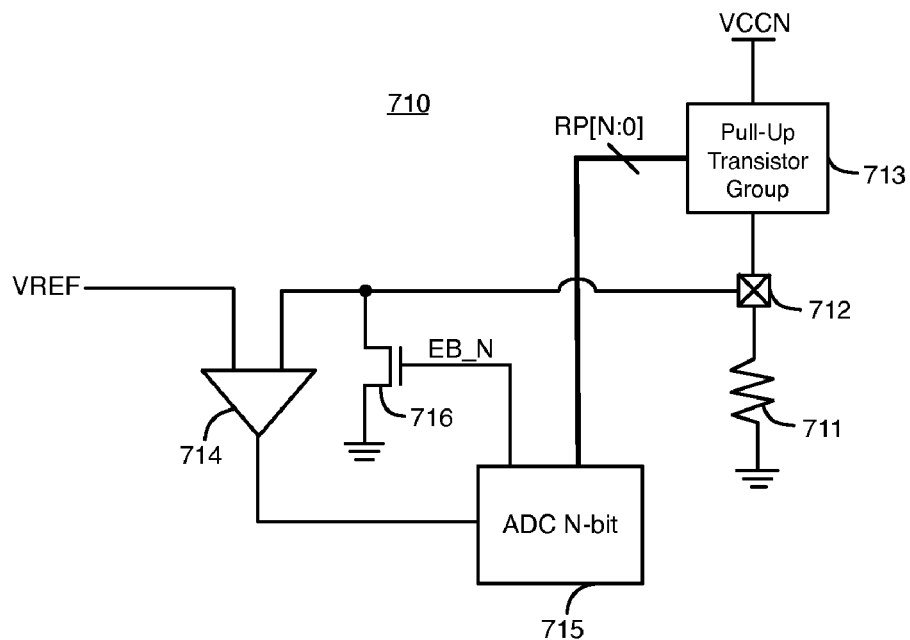
FIG. 7B illustrates a pull-up portion of an on-chip termination (OCT) calibration circuit that includes an extra pull-down transistor, according to an embodiment of the present invention.

An OCT calibration circuit that contains extra transistors according to another embodiment of the present invention is illustrated in FIGS. 7A-7B. FIG. 7A illustrates a pull-down portion 700 of an OCT calibration block that includes a pin 702, a comparator 704, an N-bit analog-to-digital converter (ADC) 705, a pull-down transistor group 703, and a pull-up transistor 706. Pin 702 is coupled to an external resistor 701. Group 703 includes any number N of binary weighted pull-down transistors that are coupled in parallel.

Initially, transistor 706 and all of the transistors in group 703 are off, and the voltage on pin 702 equals VCCN. During the calibration process, ADC 705 decreases the net resistance of transistor group 703, causing the voltage at pin 702 to decrease. When the voltage on pin 702 drops below VREF at point X+1 shown in FIG. 6C, ADC 705 turns on transistor 706 using control signal EB_P, causing the pin voltage to rise.

The size of transistor 706 is selected so that turning transistor 706 on increases the voltage at pin 702 by an amount that equals one-half the decrease in voltage at pin 702 caused by turning on the smallest pull-down transistor in group 703. Turning on transistor 706 at point X+1 causes the pin voltage to increase to the mid-point between points X and X+1.

If turning on transistor 706 at point X+1 causes the pin voltage to rise above VREF, then point X+1 is closer to VREF than point X. As a result, the calibration code generating point X+1 is selected to control the on-chip termination in one or more I/O buffers.

If turning on transistor 706 at point X+1 causes the pin voltage to remain below VREF, then point X is closer to VREF than point X+1. As a result, the calibration code generating point X is selected to control the on-chip termination in one or more I/O buffers. The control signal EB_N is not transmitted to the I/O buffers and is not used to control the termination impedance in the I/O buffers.

FIG. 7B illustrates a pull-up portion 710 of an OCT calibration block that includes a pin 712, a comparator 714, an N-bit analog-to-digital converter (ADC) 715, a pull-up transistor group 713, and a pull-down transistor 716. Pin 712 is coupled to an external resistor 711. Group 713 includes any number N of binary weighted pull-up transistors that are coupled together in parallel.

Initially, transistor 716 and all of the transistors in group 713 are off, and the voltage on pin 712 equals ground. During the calibration process, ADC 715 decreases the net resistance of transistor group 713, causing the voltage at pin 712 to increase. When the voltage on pin 712 rises above VREF at point X−1 shown in FIG. 6D, ADC 715 turns on pull-down transistor 716 using control signal EB_N, causing the pin voltage to decrease.

The size of transistor 716 is selected so that turning transistor 716 on decreases the voltage at pin 712 by an amount that equals one-half the increase in voltage at pin 712 caused by turning on the smallest pull-up transistor in group 713. Turning on transistor 716 at point X−1 causes the pin voltage to decrease to the mid-point between points X and X−1.

If turning on transistor 716 at point X−1 causes the pin voltage to remain above VREF, then point X is closer to VREF than point X−1. As a result, the calibration code generating point X is selected to control the on-chip termination in one or more I/O buffers.

If turning on transistor 716 at point X−1 causes the pin voltage to drop below VREF, then point X−1 is closer to VREF than point X. As a result, the calibration code generating point X−1 is selected to control the on-chip termination in one or more I/O buffers. The control signal EB_N is not transmitted to the I/O buffers and is not used to control the termination impedance in the I/O buffers.

Figure 8:
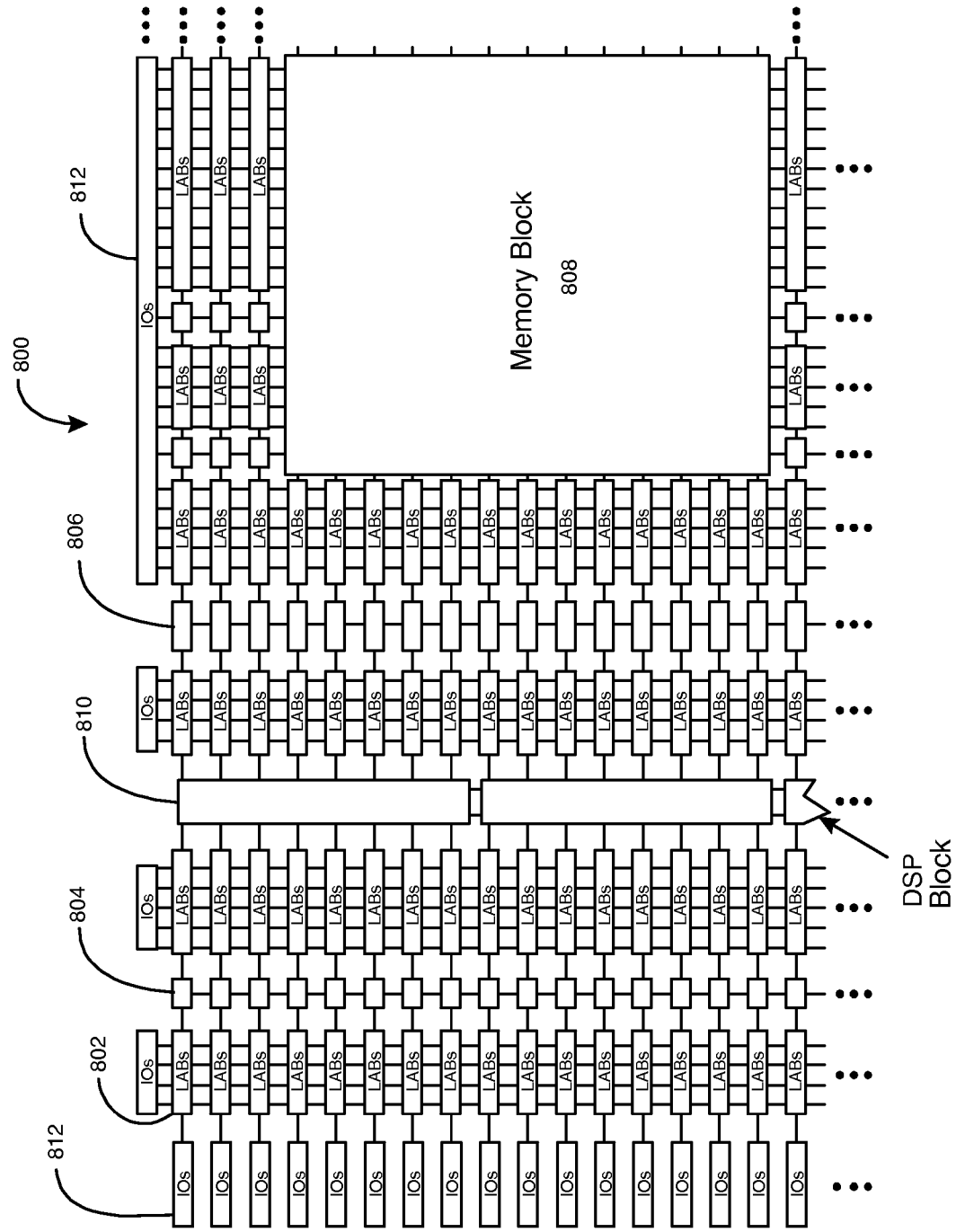
FIG. 8 is a simplified block diagram of a field programmable gate array that can embody the techniques of the present invention.

FIG. 8 is a simplified partial block diagram of an FPGA 800 that can include aspects of the present invention. FPGA 800 is merely one example of an integrated circuit that can include features of the present invention. It should be understood that the present invention can be applied to numerous types of circuits such as field programmable gate arrays (FPGAs), programmable logic devices (PLDs), complex programmable logic devices (CPLDs), programmable logic arrays (PLAs), and application specific integrated circuits (ASICs).

FPGA 800 includes a two-dimensional array of programmable logic array blocks (or LABs) 802 that are interconnected by a network of column and row interconnect conductors of varying length and speed. LABs 802 include multiple (e.g., 10) logic elements (or LEs).

An LE is a programmable logic block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 800 also includes a distributed memory structure including RAM blocks of varying sizes provided throughout the array. The RAM blocks include, for example, blocks 804, blocks 806, and block 808. These memory blocks can also include shift registers and FIFO buffers.

FPGA 800 further includes digital signal processing (DSP) blocks 810 that can implement, for example, multipliers with add or subtract features. I/O blocks (IOs) 812 located, in this example, around the periphery of the chip support numerous single-ended and differential input/output standards. Each I/O block typically includes an input buffer and an output buffer. It is to be understood that FPGA 800 is described herein for illustrative purposes only and that the present invention can be implemented in many different types of PLDs, FPGAs, and the like.

Figure 9:
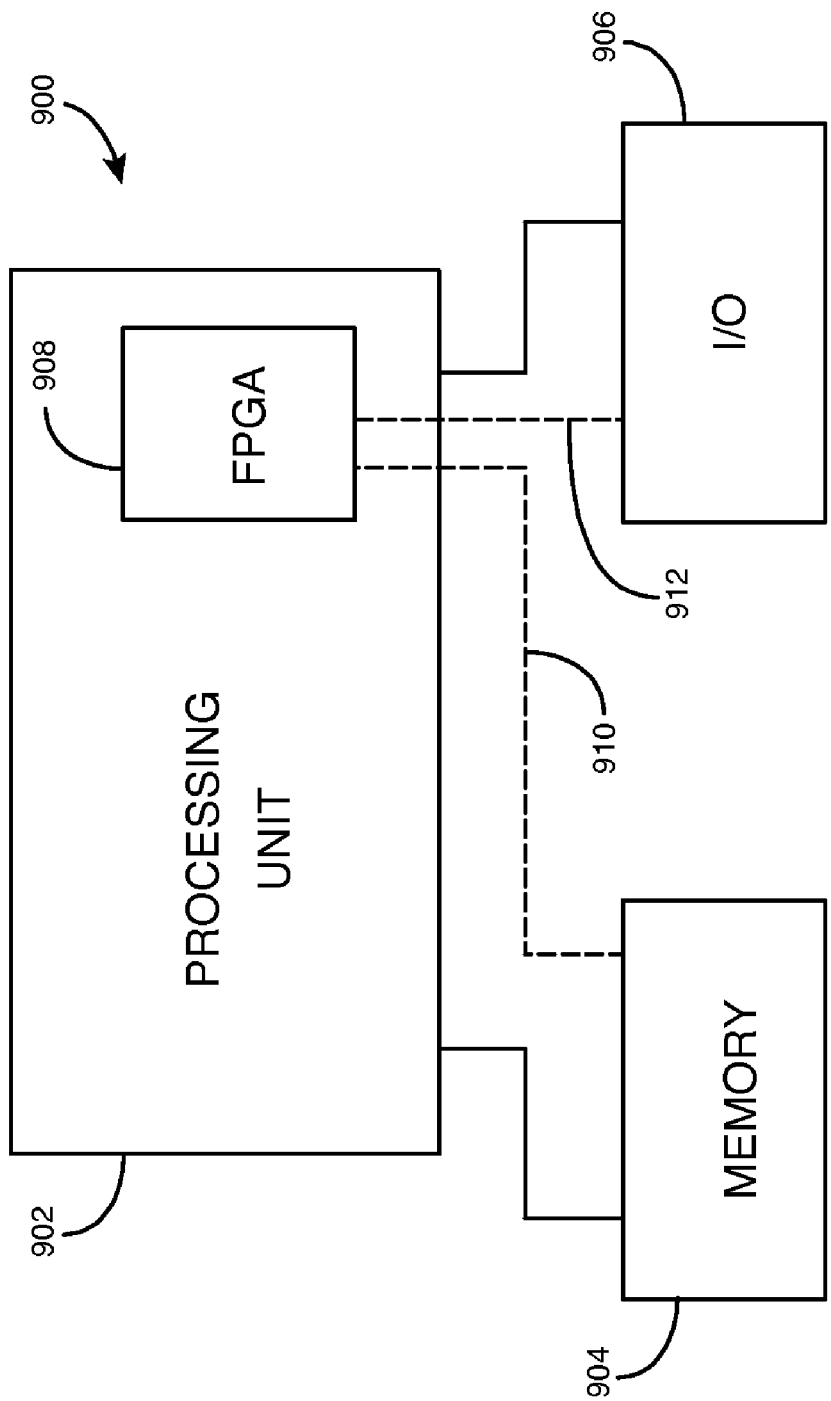
FIG. 9 is a block diagram of an electronic system that can implement embodiments of the present invention.

The present invention can also be implemented in a system that has an FPGA as one of several components. FIG. 9 shows a block diagram of an exemplary digital system 900 that can embody techniques of the present invention. System 900 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 900 can be provided on a single board, on multiple boards, or within multiple enclosures.

System 900 includes a processing unit 902, a memory unit 904 and an I/O unit 906 interconnected together by one or more buses. According to this exemplary embodiment, an FPGA 908 is embedded in processing unit 902. FPGA 908 can serve many different purposes within the system in FIG. 9. FPGA 908 can, for example, be a logical building block of processing unit 902, supporting its internal and external operations. FPGA 908 is programmed to implement the logical functions necessary to carry on its particular role in system operation. FPGA 908 can be specially coupled to memory 904 through connection 910 and to I/O unit 906 through connection 912.

Processing unit 902 can direct data to an appropriate system component for processing or storage, execute a program stored in memory 904 or receive and transmit data via I/O unit 906, or other similar function. Processing unit 902 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 908 can control the logical operations of the system. As another example, FPGA 908 acts as a reconfigurable processor, which can be reprogrammed as needed to handle a particular computing task. Alternately, FPGA 908 can itself include an embedded microprocessor. Memory unit 904 can be a random access memory (RAM), read only memory (ROM), fixed or flexible disk media, PC Card flash disk memory, tape, or any other storage means, or any combination of these storage means.

The foregoing description of the exemplary embodiments of the invention has been presented for the purposes of illustration and description. It is not intended to be exhaustive or to limit the invention to the precise form disclosed. A latitude of modification, various changes, and substitutions are intended in the present invention. In some instances, features of the invention can be employed without a corresponding use of other features as set forth. Many modifications and variations are possible in light of the above teachings, without departing from the scope of the invention. It is intended that the scope of the invention be limited not with this detailed description, but rather by the claims appended hereto.

The invention claimed is:

1. An integrated circuit having an on-chip termination (OCT) calibration control circuit, the OCT calibration control circuit comprising:
   a first group of transistors coupled in parallel to a first terminal;
   a first extra transistor coupled to the first terminal;
   a first feedback loop circuit comprising a first comparator coupled to the first terminal, the first feedback loop circuit generating first calibration codes to control the first group of transistors and a first control signal to control the first extra transistor,
   wherein the first feedback loop circuit turns on the first extra transistor after an output signal of the first comparator changes state, and the OCT calibration control circuit selects one of the first calibration codes to control a termination impedance based on whether the output signal of the first comparator changes state after the first extra transistor is turned on;
   a second group of transistors coupled in parallel to a second terminal;
   a second extra transistor coupled to the second terminal; and
   a second feedback loop circuit comprising a second comparator coupled to the second terminal, the second feedback loop circuit generating second calibration codes to control the second group of transistors and a second control signal to control the second extra transistor,
   wherein the second feedback loop circuit turns on the second extra transistor after an output signal of the second comparator changes state, and the OCT calibration control circuit selects one of the second calibration codes to control a termination impedance based on whether the output signal of the second comparator changes state after the second extra transistor is turned on.

2. The integrated circuit defined in claim 1 wherein the first feedback loop circuit includes an analog-to-digital converter coupled to the first comparator that generates the first calibration codes.

3. The integrated circuit defined in claim 2 wherein the second feedback loop circuit comprises a second analog-to-digital converter coupled to the second comparator that generates the second calibration codes.

4. The integrated circuit defined in claim 1 wherein the first group of transistors and the first extra transistor are pull-up transistors.

5. The integrated circuit defined in claim 1 wherein the first group of transistors and the first extra transistor are pull-down transistors.

6. The integrated circuit defined in claim 1 wherein the first group of transistors are pull-up transistors and the first extra transistor is a pull-down transistor.

7. The integrated circuit defined in claim 1 wherein the first group of transistors are pull-down transistors and the first extra transistor is a pull-up transistor.

8. A method for controlling an on-chip termination impedance on an integrated circuit, the method comprising:
   comparing a signal at a first terminal to a reference signal using a comparator;
   controlling conductive states of a first group of transistors coupled to the first terminal using calibration codes in response to an output signal of the comparator, wherein a first calibration code is generated prior to the output signal of the comparator changing state, and a second calibration code is generated after the output signal of the comparator changes state
   turning on an extra transistor coupled to the first terminal using a control signal after the output signal of the comparator changes state;
   determining which of the first and the second calibration codes is closest to the reference signal based on whether the output signal of the first comparator changes state after the extra transistor is turned on by the control signal;
   selecting the first calibration code if the first calibration code generates a signal at the first terminal that is closest to the reference signal;
   selecting the second calibration code if the second calibration code generates a signal at the first terminal that is closed to the reference signal;
   controlling a termination impedance of a buffer at a first pin using the selected calibration code.

9. The method defined in claim 8 further comprising:
   selectively enabling a second group transistors in the buffer in response to the selected calibration code.

10. The method defined in claim 8 wherein controlling the conductive states of the first group of transistors coupled to the first terminal using the calibration codes further comprises controlling the conductive states of the first group of transistors using an analog-to-digital converter that generates the calibration codes.

11. The method defined in claim 8 wherein the first group of transistors and the extra transistor are pull-down transistors, and the termination impedance at the first pin is not controlled by the control signal.

12. The method defined in claim 8 wherein the first group of transistors and the extra transistor are pull-up transistors, and the termination impedance at the first pin is not controlled by the control signal.

13. The method defined in claim 8 wherein the first group of transistors are pull-up transistors, and the extra transistor is a pull-down transistor, and the termination impedance at the first pin is not controlled by the control signal.

14. The method defined in claim 8 wherein the first group of transistors are pull-down transistors, and the extra transistor is a pull-up transistor, and the termination impedance at the first pin is not controlled by the control signal.

15. An integrated circuit comprising:
   a calibration control circuit having a first group of transistors coupled to a first terminal, a first extra transistor coupled to the first terminal, and a first feedback loop circuit coupled to the first terminal that generates calibration codes to control conductive states of the first group of transistors and a first control signal to control a conductive state of the first extra transistor, wherein the first feedback loop circuit comprises a first comparator that compares a voltage at the first terminal to a reference voltage, the first feedback loop circuit generates a first calibration code before an output signal of the first comparator changes state and a second calibration code after the output signal of the first comparator changes state, the calibration control circuit determines which of the first and the second calibration codes is closest to the reference voltage based on whether the output signal of the first comparator changes state after the first extra transistor is turned on by the first control signal, the calibration control circuit selects the first calibration code if the first calibration code generates a voltage at the first terminal that is closest to the reference voltage, and the calibration control circuit selects the second calibration code if the second calibration code generates a voltage at the first terminal that is closest to the reference voltage; and a buffer circuit that controls a termination impedance at a first pin in response to the selected calibration code.

16. The integrated circuit defined in claim 15 wherein the calibration control circuit further comprises a second group of transistors coupled to a second terminal, a second extra transistor coupled to the second terminal, and a second feedback loop circuit coupled to the second terminal that generates calibration codes to control conductive states of the second group of transistors and a second control signal to control a conductive state of the second extra transistor, wherein the second feedback loop circuit comprises a second comparator that compares a voltage at the second terminal to a reference voltage, the second feedback loop circuit generates a third calibration code before an output signal of the second comparator changes state and a fourth calibration code after the output signal of the second comparator changes state, the calibration control circuit determines which of the third and the fourth calibration codes is closest to the reference voltage based on whether the output signal of the second comparator changes state after the second extra transistor is turned on by the second control signal, the calibration control circuit selects the third calibration code if the third calibration code generates a voltage at the second terminal that is closest to the reference voltage, and the calibration control circuit selects the fourth calibration code if the fourth calibration code generates a voltage at the second terminal that is closest to the reference voltage, wherein the buffer circuit controls a termination impedance at the first pin in response to the selected calibration code generated by the second feedback loop circuit, the first group of transistors are pull-up transistors, and the second group of transistors are pull-down transistors.

17. The integrated circuit defined in claim 15 wherein the first feedback loop further comprises:
an analog-to-digital converter circuit coupled to receive an output signal of the first comparator and generating the calibration codes.

18. The integrated circuit defined in claim 16 wherein the termination impedance at the first pin is not controlled by the first control signal.

19. The integrated circuit defined in claim 15 wherein the integrated circuit is a field programmable gate array.

20. A method for controlling an on-chip termination impedance on an integrated circuit, the method comprising:
comparing a voltage at a first terminal to a reference voltage using a first comparator;
generating a first set of calibration codes in response to an output signal of the first comparator to selectively control conductive states of a first group of transistors coupled to the first terminal, wherein a first calibration code is generated before the output signal of the first comparator changes state, and a second calibration code is generated after the output signal of the first comparator changes state;
generating a first control signal to control a conductive state of a first extra transistor coupled to the first terminal;
determining which of the first and the second calibration codes is closet to the reference voltage based on whether the output signal of the first comparator changes state after the first extra transistor is turned on by the first control signal;
selecting the first calibration code if the first calibration code generates a voltage at the first terminal that is closest to the reference voltage;
selecting the second calibration code if the second calibration code generates a voltage at the first terminal that is closest to the reference voltage; and
transmitting the selected calibration code to a buffer to control a termination impedance of the buffer at a first pin.

21. The method defined in claim 20 further comprising:
selectively enabling a second group of transistors in the buffer in response to the selected calibration code, wherein the termination impedance is not controlled by the first control signal.

22. The method defined in claim 20 wherein generating the first set of calibration codes and the first control signal further comprises generating the first set of calibration codes and the first control signal using an analog-to-digital converter.

23. The method defined in claim 20 further comprising:
comparing a voltage at a second terminal to a reference voltage using a second comparator;
generating a second set of calibration codes in response to an output signal of the second comparator to selectively control conductive states of a second group of transistors coupled to the second terminal, wherein a third calibration code is generated before the output signal of the second comparator changes state, and a fourth calibration code is generated after the output signal of the second comparator changes state;
generating a second control signal to control a conductive state of a second extra transistor coupled to the second terminal;
determining which of the third and the fourth calibration codes is closest to the reference voltage based on whether the output signal of the second comparator changes state after the second extra transistor is turned on by the second control signal;
selecting the third calibration code if the third calibration code generates a voltage at the second terminal that is closest to the reference voltage;
selecting the fourth calibration code if the fourth calibration code generates a voltage at the second terminal that is closest to the reference voltage; and
transmitting the selected one of the third and fourth calibration codes to the buffer to control a termination impedance of the buffer at the first pin, wherein the first group of transistors are pull-up transistors, and the second group of transistors are pull-down transistors.

24. An integrated circuit comprising an on-chip termination (OCT) calibration circuit, the OCT calibration circuit comprising:
first transistors coupled to a first terminal; and
a first feedback loop circuit coupled to the first transistors that generates first calibration codes to control conductive states of the first transistors in response to a first comparison between a signal at the first terminal and a first reference signal, and in response to a second comparison between a signal at the first terminal and a second reference signal, wherein the OCT calibration circuit selects one of the first calibration codes to control an on-chip termination impedance at a pin.

25. The integrated circuit defined in claim 24 wherein the OCT calibration circuit determines if one of the first calibration codes generates a signal at the first terminal between the first and the second reference signals,
and if one of the first calibration codes generates a signal at the first terminal between the first and the second reference signals, the OCT calibration circuit selects that first calibration code to control the on-chip termination impedance.

26. The integrated circuit defined in claim 25 wherein the OCT calibration circuit selects the first calibration code that is nearest to the first reference signal if one of the first calibration codes does not generate a signal at the first terminal between the first and the second reference signals.

27. The integrated circuit defined in claim 24 wherein the first feedback loop circuit further comprises a first comparator that generates the first comparison and a second comparator that generates the second comparison.

28. The integrated circuit defined in claim 24 wherein the OCT calibration circuit further comprises:
   second transistors coupled to a second terminal; and
   a second feedback loop circuit coupled to the second transistors that generates second calibration codes to control conductive states of the second transistors in response to a third comparison between a signal at the second terminal and the first reference signal, and in response to a fourth comparison between a signal at the second terminal and a third reference signal,
   wherein the third and the fourth comparisons are used to select one of the second calibration codes to control an on-chip termination impedance at the pin.

29. The integrated circuit defined in claim 24 wherein the first feedback loop circuit generates the first calibration codes to control the conductive states of the first transistors in response to a third comparison between a signal at the first terminal and a third reference signal.

30. The integrated circuit defined in claim 29 wherein the OCT calibration circuit determines if one of the first calibration codes generates a signal at the first terminal between the first and the second reference signals,
   if one of the first calibration codes does not generate a signal at the first terminal between the first and the second reference signals, the OCT calibration circuit determines if one of the first calibration codes generates a signal at the first terminal between the first and the third reference signals, and
   if one of the first calibration codes generates a signal at the first terminal between the first and the third reference signals, the OCT calibration circuit selects that first calibration code to control the on-chip termination impedance.

31. The integrated circuit defined in claim 30 wherein the difference between the first and the second reference signals is less than the difference between the first and the third reference signals.

32. The integrated circuit defined in claim 24 wherein the first feedback loop circuit comprises:
   a comparator; and
   a select logic circuit coupled to receive the first and the second reference signals that selectively couples one of the reference signals to an input of the comparator.

33. The integrated circuit defined in claim 32 wherein the select logic circuit is coupled to a third reference signal, and the first feedback loop circuit generates the first calibration codes to control the conductive states of the first transistors in response to a third comparison between a signal at the first terminal and the third reference signal.

34. A method for controlling an on-chip termination impedance on an integrated circuit, the method comprising:
   comparing a signal at a first terminal to a first reference signal to generate a first comparison signal;
   comparing a signal at the first terminal to a second reference signal to generate a second comparison signal;
   generating calibration codes to selectively control conductive states of first transistors coupled to the first terminal in response to the first and the second comparison signals; and
   selecting one of the calibration codes to control an on-chip termination impedance at a pin.

35. The method defined in claim 34 wherein selecting one of the calibration codes further comprises determining if one of the calibration codes generates a signal at the first terminal between the first and the second reference signals,
   and if one of the calibration codes generates a signal at the first terminal between the first and the second reference signals, selecting that calibration code to control the on-chip termination impedance.

36. The method defined in claim 35 wherein selecting one of the calibration codes further comprises selecting the calibration code nearest to the first reference signal if one of the calibration codes does not generate a signal at the first terminal between the first and the second reference signals.

37. The method defined in claim 34 wherein the signal at the first terminal is compared to the first reference signal using a first comparator, and the signal at the first terminal is compared to the second reference signal using a second comparator.

38. The method defined in claim 34 wherein the signal at the first terminal is compared to the first reference signal using a first comparator, and the signal at the first terminal is compared to the second reference signal using the first comparator.

39. The method defined in claim 38 further comprising:
   selecting one of the first and the second reference signals using select logic to generate a selected reference signal that is provided to an input of the first comparator.

40. The method defined in claim 34 further comprising:
   comparing a signal at the first terminal to a third reference signal to generate a third comparison signal, wherein the calibration codes are generated in response to the first, the second, and the third comparison signals.

41. The method defined in claim 40 wherein the signal at the first terminal is compared to the first reference signal using a first comparator, the signal at the first terminal is compared to the second reference signal using the first comparator, and the signal at the first terminal is compared to the third reference signal using the first comparator; and the method further comprises:
   selecting one of the first, the second, and the third reference signals using select logic to generate a selected reference signal that is provided to an input of the first comparator.

42. The method defined in claim 40 wherein selecting one of the calibration codes further comprises determining if one of the calibration codes generates a signal at the first terminal between the first and the second reference signals,
   if one of the calibration codes does not generate a signal at the first terminal between the first and the second reference signals, determining if one of the calibration codes generates a signal at the first terminal between the first and the third reference signals, and
   if one of the calibration codes generates a signal at the first terminal between the first and the third reference signals, selecting that calibration code to control the on-chip termination impedance.

43. An integrated circuit comprising an on-chip termination (OCT) calibration circuit, the OCT calibration circuit comprising:
   first transistors coupled to a first terminal; and
   a first feedback loop circuit comprising a first comparator coupled to receive a signal from the first transistors, the first feedback loop circuit generating first calibration codes for controlling conductive states of the first transistors, wherein the first feedback loop circuit compares a first reference voltage to a voltage at the first terminal and a second reference voltage to the voltage at the first terminal, the OCT calibration circuit determines if one of the first calibration codes generates a voltage at the first terminal that is between the first and the second reference voltages, and if the OCT calibration circuit determines that one of the first calibration code generates a voltage at the first terminal between the first and the second reference voltages, the OCT calibration circuit transmits the calibration code to a buffer to control an on-chip termination impedance in the buffer at a pin.

44. The integrated circuit defined in claim 43 wherein the first feedback loop circuit compares a third reference voltage to the voltage at the first terminal, the OCT calibration circuit determines if one of the first calibration codes generates a voltage at the first terminal that is between the second and the third reference voltages, and if the OCT calibration circuit determines that one of the first calibration codes generates a voltage at the first terminal between the second and the third reference voltages, the OCT calibration circuit transmits that calibration code to the buffer to control an on-chip termination impedance in the buffer at the pin.

45. The integrated circuit defined in claim 44 wherein a difference between the first and the second reference voltages is twice a difference between the second and the third reference voltages.

46. The integrated circuit defined in claim 43 further comprising a select logic circuit that selects one of the first and the second reference voltages and couples the selected reference voltage to the input of the first comparator.

47. The integrated circuit defined in claim 43 wherein the OCT calibration circuit further comprises:
 second transistors coupled to a second terminal; and
 a second feedback loop circuit comprising a second comparator coupled to receive a signal from the second transistors, the second feedback loop circuit generating second calibration codes for controlling conductive states of the second transistors,
 wherein the second feedback loop circuit compares the first reference voltage to a voltage at the second terminal and a third reference voltage to the voltage at the second terminal, the OCT calibration circuit determines if one of the second calibration codes generates a voltage at the second terminal that is between the first and the third reference voltages, and if the OCT calibration circuit determines that one of the second calibration codes generates a voltage at the second terminal between the first and the third reference voltages, the OCT calibration circuit transmits that calibration code to the buffer to control an on-chip termination impedance in the buffer at the pin, wherein the first transistors are pull-up transistors and the second transistors are pull-down transistors.

* * * * *